United States Patent
Taylor

(10) Patent No.: US 8,117,247 B1
(45) Date of Patent: Feb. 14, 2012

(54) CONFIGURABLE ARITHMETIC BLOCK AND METHOD OF IMPLEMENTING ARITHMETIC FUNCTIONS IN A DEVICE HAVING PROGRAMMABLE LOGIC

(75) Inventor: Bradley L. Taylor, Santa Cruz, CA (US)

(73) Assignee: Xilinx, Inc., San Jose, CA (US)

(*) Notice: Subject to any disclaimer, the term of this patent is extended or adjusted under 35 U.S.C. 154(b) by 1167 days.

(21) Appl. No.: 11/880,140

(22) Filed: Jul. 19, 2007

(51) Int. Cl.
*G06F 7/38* (2006.01)

(52) U.S. Cl. ...................................... 708/235; 708/524

(58) Field of Classification Search .......... 708/230–236, 708/523–524
See application file for complete search history.

(56) References Cited

U.S. PATENT DOCUMENTS

| | | | |
|---|---|---|---|
| 5,941,940 A | 8/1999 | Prasad et al. | |
| 6,526,430 B1 | 2/2003 | Hung et al. | |
| 7,167,021 B1* | 1/2007 | Lewis | 326/37 |
| 7,218,139 B1 | 5/2007 | Young et al. | |
| 7,467,175 B2 | 12/2008 | Simkins et al. | |
| 7,467,177 B2 | 12/2008 | Simkins et al. | |
| 7,472,155 B2 | 12/2008 | Simkins et al. | |
| 7,480,690 B2 | 1/2009 | Simkins et al. | |
| 7,746,305 B2* | 6/2010 | Ham | 345/89 |
| 7,840,627 B2 | 11/2010 | Simkins et al. | |
| 7,840,630 B2 | 11/2010 | Simkins et al. | |
| 7,844,653 B2 | 11/2010 | Simkins et al. | |
| 7,849,119 B2 | 12/2010 | Simkins et al. | |
| 7,853,632 B2 | 12/2010 | Simkins et al. | |
| 7,853,634 B2 | 12/2010 | Simkins et al. | |
| 7,853,636 B2 | 12/2010 | Simkins et al. | |
| 7,860,915 B2 | 12/2010 | Simkins et al. | |
| 7,865,542 B2 | 1/2011 | Simkins et al. | |
| 7,870,182 B2 | 1/2011 | Simkins et al. | |
| 7,882,165 B2 | 2/2011 | Simkins et al. | |
| 2002/0124038 A1* | 9/2002 | Saitoh et al. | 708/513 |
| 2003/0115233 A1 | 6/2003 | Hou et al. | |
| 2005/0144210 A1 | 6/2005 | Simkins et al. | |
| 2006/0288070 A1 | 12/2006 | Vadi et al. | |

FOREIGN PATENT DOCUMENTS

WO  WO 2005/066832 A2  7/2005

OTHER PUBLICATIONS

Guevorkian, David et al "A Method for Designing High-Radix Multiplier-Based Processing Units for Multimedia Applications"; IEEE Transactions on Circuits and Systems for Video Technology; vol. 15, No. 5; May 2005; Copyright 2005 IEEE; pp. 716-725.
Xilinx, Inc.; U.S. Appl. No. 11/880,361 by Taylor filed Jul. 19, 2007.
Xilinx, Inc.; U.S. Appl. No. 11/880,141 by Taylor filed Jul. 19, 2007.

* cited by examiner

*Primary Examiner* — Tan Mai
(74) *Attorney, Agent, or Firm* — John J. King; Lois D. Cartier

(57) ABSTRACT

A configurable arithmetic block in a device having programmable logic for implementing arithmetic functions is disclosed. The configurable arithmetic block comprises a plurality of input registers coupled to receive multiple bit words; an arithmetic function circuit coupled to receive the multiple bit words; an output selection circuit coupled to receive the output of the plurality of input registers and an output of the arithmetic function circuit; and a plurality of output registers coupled the output selection circuit. A method of implementing arithmetic functions in a device having programmable logic is also disclosed.

12 Claims, 16 Drawing Sheets

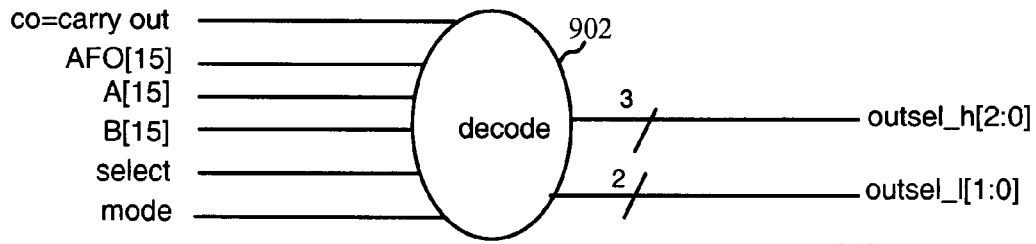
FIG. 9
| mode[2:0] | inputs | outsel_h | outsel_l |
|---|---|---|---|
| Mult or 8-bit mode | don't care | dni | AFO |
| add/sub 16-bit | don't care | AFO | AFO |
| max | AFO[15] =[0,1] | A,B | A,B |
| sat add | overflow=[none, pos,neg] | AFO, 0x7f,0x00 | AFO, 0xff, 0x00 |
| accumulate | select=[0,1] | AFO , A | AFO , A |
| mux | select=[0,1] | A,B | A,B |
FIG. 10
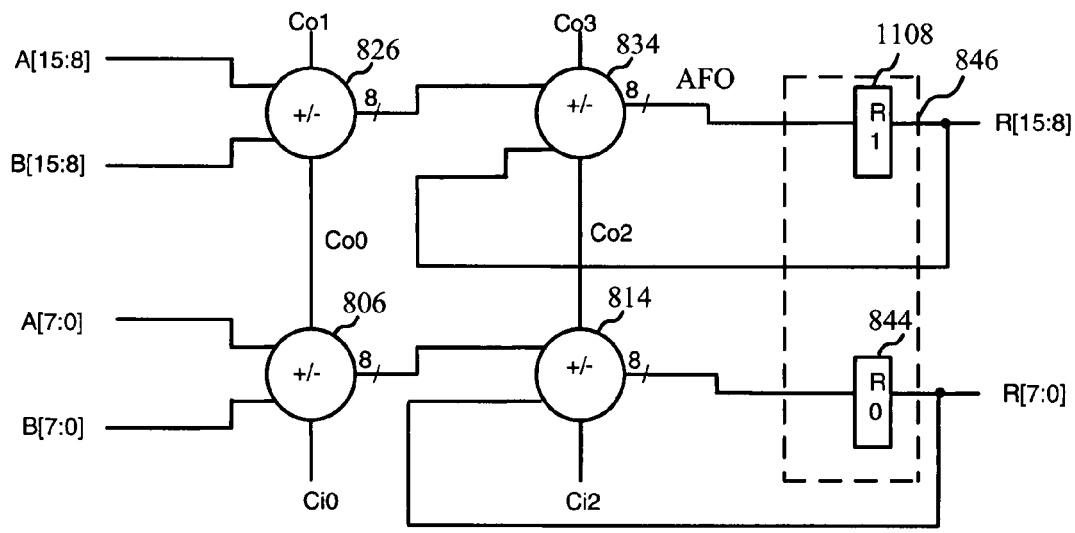
FIG. 11

$z[33:0]=a[31:0]+b[31:0]$ $z[9:0] = a[7:0] + b[7:0] + c[7:0] + d[7:0]$

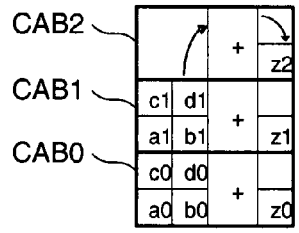
$z[17:0] = a[15:0] + b[15:0] + c[15:0] + d[15:0]$
FIG. 15
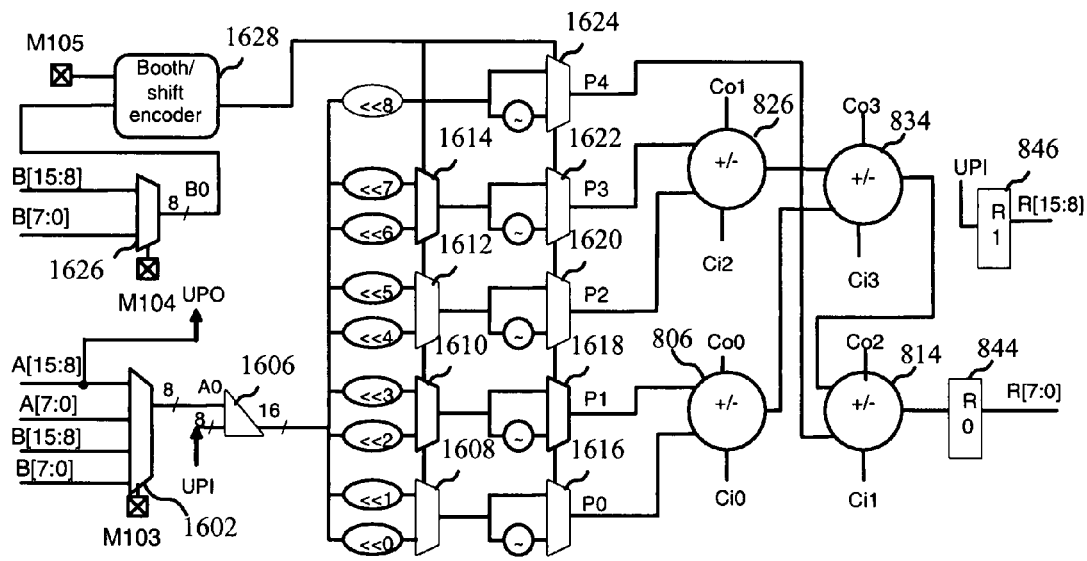
FIG. 16
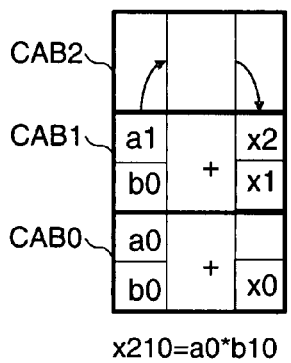
x210=a0*b10
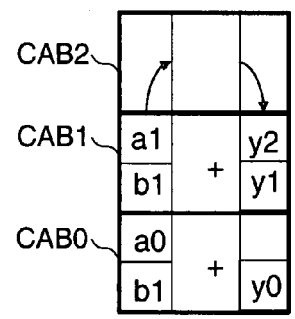
y210=a0*b10
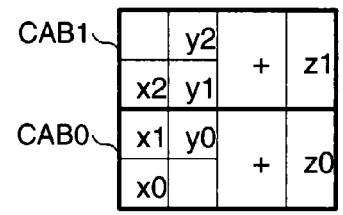
z[31:0]=x210 + y210<<8
+ z[31:0]
FIG. 17 x[23:0] = a[15:0] * b[7:0]

a3210<<b z3210 = concat(z3,z2,z1,z0 )

z= mux(a,b,c,d)>>ctrl

| Signal | Bits | Type | Description |
|---|---|---|---|
| F | 4 | primary slice input | |
| G | 5 | primary slice input | |
| H | 8 | Secondary slice input | decoded to form write enables |
| I | 16 | instruction input | concatenation of H input from slice 0,1,2,3 of CLB |
| X | 1 | primary slice output | |
| Y | 1 | primary slice output | |
| Z | 4 | secondary slice output | |
| ACI | 4 | cascade input | 'a' signal from CLB to left. Used as part of mult |
| ACO | 4 | cascade output | 'a' signal to CLB to right. Used as part of mult |
| PCI | 4 | cascade input | 'p' signal from slice at upper left. Used as part of mult |
| PCO | 4 | cascade output | 'p' signal to slice lower right. Used as part of mult |
| CCI | 2 | cascade input | carry in from slice below |
| CCO | 2 | cascade output | carry out to slice above |
| SCI | 2 | cascade input | shift in from slice above |
| SCO | 2 | cascade output | shift out to slice below |
| a | 4 | internal | input to shifter from flut3 register |
| b | 4 | internal | input to shifter and adder from flut2 register |
| c | 4 | internal | used as optional input or output register from flut1 register |
| d | 4 | internal | feedback register for adder from flut0 register |
| i | 16 | instruction | instruction from g register |
| ia | 2 | instruction | instruction for 'a' multiply |
| ib | 2 | instruction | instruction for 'b' multiply |
| ic | 2 | instruction | instruction for carry mode |
| id | 1 | instruction | instruction for 'd' multiply |
| ao | 4 | internal | output of 'a' multiply |
| bo | 4 | internal | output of 'b' multiply |
| do | 4 | internal | output of 'd' multiply |
| n | 5 | instruction | shift value |
| so | 4 | internal | shifter output |
| m | 5 | instruction | multiply value |
| mo | 4 | internal | mult output |
| po | 4 | internal | adder output |

FIG. 23

| MODE | DESCRIPTION | OPERATION |
|---|---|---|
| lut4 | dual 4LUT | X=f [F], Y=g [G] |
| lut5 | 5LUT | Y=fg [F] |
| dly | 4- bit shift register | a=b, b=c, c=d, d=a>>n \| g<<n |
| dpmem | 4- bit dual port RAM | fg[H]=G, Z=fg[F]; |
| shift | b concat a, down shifted by n | s={b:a}>>n; |
| add | 3 input addsub | p=ao*ia+b*ib+d*id; ia,ib={0,1,-1} id={0,1} |
| mult | multiply accumulate | p=a*m+d*id; |

FIG. 24

| bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| source reg | g15 | g14 | g13 | g12 | g11 | g10 | g9 | g8 | g7 | g6 | g5 | g4 | g3 | g2 | g1 | g0 |
| name | ic1 | ic0 | id | n4 | n3 | n2 | n1 | n0 | m3 | m2 | m1 | m0 | ib1 | ib0 | ia1 | ia0 |
| LUT4 | lut15 | lut14 | lut13 | lut12 | lut11 | lut10 | lut9 | lut8 | lut7 | lut6 | lut5 | lut4 | lut3 | lut2 | lut1 | lut0 |
| DLY | 0 | 0 | 0 | 0 | 0 | 0 | s1 | s0 | 0 | 0 | 0 | 0 | 0 | 0 | 0 | 0 |
| adder | ic1 | ic0 | id | 0 | 0 | 0 | 0 | 0 | 0 | 0 | 0 | 0 | cb1 | cb0 | ca1 | ca0 |
| shifter | 0 | 0 | 0 | shift3 | shift3 | shift2 | shift1 | shift0 | 0 | 0 | 0 | 0 | 1 | 0 | 0 | 0 |
| mult | ic1 | ic0 | id | 0 | 0 | 0 | 0 | 0 | m3 | m2 | m1 | m0 | 0 | 1 | 0 | 0 |
| mux | 0 | 0 | 0 | 0 | sel16 | sel8 | sel4 | sel2 | 0 | 0 | 0 | 0 | 1 | 0 | 0 | 0 |

FIG. 25

CONFIGURABLE ARITHMETIC BLOCK AND METHOD OF IMPLEMENTING ARITHMETIC FUNCTIONS IN A DEVICE HAVING PROGRAMMABLE LOGIC

FIELD OF THE INVENTION

The present invention relates generally to devices having programmable logic, and in particular, to a configurable arithmetic block implemented in a device having programmable logic.

BACKGROUND OF THE INVENTION

A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, commonly called flash memory. An example of a non-volatile memory is a read-only memory (ROM) (e.g., a programmable ROM (PROM), an erasable PROM (EPROM), or an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of the configuration logic blocks. At the end of this start-up phase, the PLD is now specialized to the user's design, and the PLD enters into a "user" mode as part of its normal operation.

Whenever an architecture of a PLD changes, it is necessary that the new design addresses backward compatibility with previous designs. That is, it is important that the new PLD architecture be able to able to implement circuits designed for previous architectures of a PLD to enable the use of those circuit designs on the new architecture. Compatibility reduces the development required for new designs, since older netlists will still map to the new architecture. While digital signal processing (DSP) designers typically use word operations such as add, subtract and multiply, conventional PLDs typically operate at the bit level. However, the performance of bit oriented adders in PLDs is generally inefficient. Further, the performance of wide adders, such as 16-48-bit wide adders, is minimized in conventional devices. Without supporting high level abstractions directly, devices having different internal architectures may not be able to map the same operations transparent to the user. Further, while DSP operations tend to be smoothly scalable in word width, word oriented architectures of conventional DSPs tend to be inefficient when implementing word sizes which are not multiples of the unit word size.

Further, while conventional PLDs are inefficient when implementing arithmetic operations typical of DSP applications, the cost of interconnects associated with conventional PLDs implementing arithmetic operations is high. A bit-oriented interconnect pattern of conventional PLDs implementing arithmetic operations increases the configuration memory requirements, as well as the total depth of necessary interconnect multiplexing. Further, dissimilar blocks in the PLD fabric implementing multipliers or dedicated DSP blocks are generally inefficient and difficult to optimize. That is, these types of heterogeneous blocks require significant additional software to determine optimal mapping and partitioning strategies. More importantly, optimized hardware resources in conventional devices having programmable logic are not matched to the statistical usage found in typical DSP applications, an therefore are inherently inefficient. For example, while multipliers are common in DSP applications, adders are more common. Similarly, while 16-bit words are common, 64-bit words a much less common. However, conventional devices do not support arbitrary word sizes, and are not optimized to support specific operations and word sizes. Further, conventional PLDs implementing DSPs will often include circuits which go unused. That is, conventional PLDs do not allow the arithmetic fabric to be borrowed by an adjacent arithmetic unit and used for overflow bits or to extend the precision of the arithmetic units. Accordingly, the density of logical operators is low. Conventional devices also have inherent problems with latency. For example, conventional PLDs implementing DSP functions run at the minimum of the maximum frequencies of each operation, and the frequency is variable depending on signal routing. Finally, conventional PLDs implementing DSP designs encounter the issue of pipeline balancing, requiring the insertion of additional registers which reduces density.

Accordingly, there is a need for an improved circuit and method of implementing arithmetic functions in a programmable logic device enabling increasing the density and frequency of a DSP and reducing cost and power of DSP designs in PLDs.

SUMMARY OF THE INVENTION

A configurable arithmetic block in a device having programmable logic for implementing arithmetic functions is disclosed. The configurable arithmetic block comprises a plurality of input registers coupled to receive multiple bit words; an arithmetic function circuit coupled to receive the multiple bit words; an output selection circuit coupled to receive the output of the plurality of input registers and an output of the arithmetic function circuit; and a plurality of output registers coupled the output selection circuit. The plurality of input registers may comprise a plurality of lookup tables. The arithmetic function circuit may be coupled to receive a carry-in input signal and generate a carry-out output signal for enabling transferring carry signals with other configurable arithmetic logic blocks. Further, an adder extension input and an adder extension output may be provided to enable the sharing of arithmetic function circuits with other configurable arithmetic logic blocks of the device. The output selection circuit of the configurable arithmetic block may coupled to receive a data input signal and generate a data-out signal, wherein the output selection circuit selects one of an output of the plurality of input registers, the output of the arithmetic function circuit, or the data input signal.

According to an alternate embodiment, a configurable arithmetic block in a device having programmable logic for implementing arithmetic functions comprises a plurality of input registers each comprising a programmable shift register coupled to receive multiple bit words and generate outputs comprising a multiple bit word and a serial input data signal; an arithmetic function circuit coupled to receive the outputs of the plurality of input registers; and a plurality of output registers coupled to the arithmetic function circuit. The configurable arithmetic block may further comprise an output selection circuit coupled to receive an output of the plurality of input registers and an output of the arithmetic function circuit, wherein the output selection circuit is further coupled to receive a data input signal from another configurable arithmetic block of the device.

A method of implementing arithmetic functions in a device having programmable logic is also disclosed. The method comprises programming an input register to receive a plurality of multiple bit words; receiving a plurality of multiple bit words at the input register; coupling an arithmetic function circuit to the input register to receive the multiple bit words; and selecting an output from an output of the input register and an output of the arithmetic function circuit. The method may further comprise enabling carry functions between the arithmetic function circuit and another arithmetic function circuit by way of a carry-in input and a carry-out output, or enabling sharing of arithmetic circuits of another arithmetic function circuit by way of an adder extension output.

BRIEF DESCRIPTION OF THE DRAWINGS

FIG. 9 is a block diagram of an output multiplexer control circuit according to an embodiment of the present invention;

FIG. 10 is a table showing the operation of the output multiplexer control circuit of FIG. 9 according to an embodiment of the present invention;

FIG. 11 is a block diagram of an implementation of the arithmetic logic circuit of FIG. 8 configured in a 16-bit mode according to an embodiment the present invention;

FIG. 15 is a diagram showing adding functions employing 16-bit slices using the circuit of FIG. 13 according to an alternate embodiment of the present invention;

FIG. 16 is a block diagram of an implementation of the arithmetic function circuit configured in a multiply slice mode according to an embodiment of the present invention;

FIG. 17 is a diagram showing an 16-bit multiply accumulate function using the circuit of FIG. 16 having 8 bit slices according to an embodiment of the present invention;

FIG. 23 is a table providing a description of the signals of the circuit of FIG. 22 according to an embodiment the present invention;

FIG. 24 is a table showing examples of the operating modes of the circuit of FIG. 22 according to an embodiment of the present invention;

FIG. 25 is a table showing the configuration of the circuit enabling various operating modes of the circuit of FIG. 22 according to an embodiment of the present invention;

DETAILED DESCRIPTION

Figure 1:
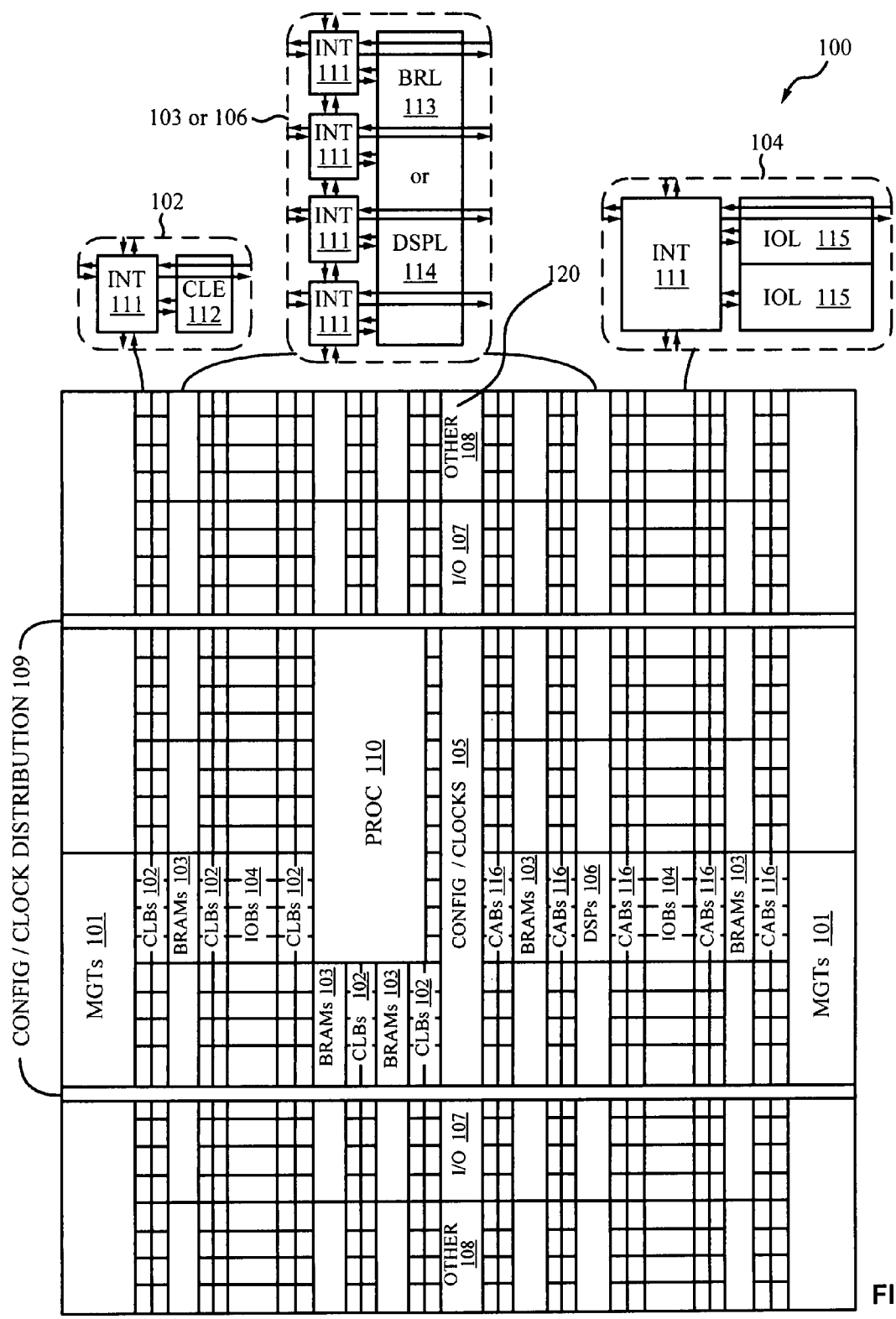
FIG. 1 is a block diagram of a programmable logic device for implementing arithmetic functions according to an embodiment the present invention.

Turning first to FIG. 1, a block diagram of a programmable logic device for implementing arithmetic functions according to an embodiment the present invention is shown. The FPGA architecture 100 of FIG. 1 includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). The CLE will be described in more detail in reference to FIG. 2. A BRAM 103 may include a BRAM logic element (BRL 113) in addition to one or more programmable interconnect elements. The FPGA of FIG. 1 further comprises configurable arithmetic blocks (CABs) 116, which will be described in more detail below in reference to FIGS. 4-25. A CAB 116 is a block of programmable logic which is configured to optimize arithmetic functions, enabling the efficient implementation of DSP functions while still providing basic LUT based logic functions. The BRAM comprises dedicated memory separate from the distributed RAM of a configuration logic block.

Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) comprising an input/output port in addition to one instance of the programmable interconnect element (INT 111). In the pictured embodiment, a columnar area near the center of the die, 120 in FIG. 1, is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of integrated circuit having programmable logic. While the block diagram of FIG. 1 shows both CLBs and CABs, the circuit of FIG. 1 may include all CABs to maintain uniformity of the blocks of configurable logic of the device. According to one aspect of the invention, the FPGA is optimized by reducing the fabric comprising configurable logic to one uniform CAB having configurable logic which is optimized for DSP functions.

As will be described in more detail below, the CAB 116 is optimized to support the arithmetic operations typical of DSP applications. In particular, by adopting an advanced architecture based on arrays of adder cells in addition to lookup table (LUT) cells, the FPGA 100 has increased density and frequency, and reduced cost and power compared to conventional FPGAs implementing DSP designs. The CAB architecture also addresses the issue of pipeline balancing. While pipeline balancing typically requires providing additional registers which reduce the density of the programmable logic device, the CAB according to the various embodiments described below has an improved ability to balance pipelines without requiring additional circuitry, and supports automated software approaches to pipeline balancing. The CABs according to the various embodiments described below are also backwards compatible with older architectures. In particular, the CAB addresses backward compatibility by raising the abstraction level to arithmetic operators rather than logic bits operations. This allows new architectures to support the arithmetic operators, while still changing the underlying hardware.

The requirements for digital signal processing functions are different than the requirements for other logic circuits, as described in Table 1 below. For example, the base unit of a typical logic circuit in a programmable logic device is a 4-input LUT, while the base unit of a circuit implementing DSP functions is a 2 input adder. Similarly, the critical path of the logic circuit includes a first-in, first-out (FIFO) circuit, a multiplexer or a state machine, while the critical path in a circuit implementing DSP functions is an adder. Further, while the pipelining and resource sharing of a logic circuit is low in a typical logic circuit, pipelining and resource sharing of a circuit implementing DSP functions is high. As will be described in more detail below, the word size of the CABs implementing DSP functions is greater than one bit, and the frequency of the operation of the CAB is not limited to the slowest maximum frequency of a function of the logic.

TABLE 1

|  | Logic | DSP | Comments |
| --- | --- | --- | --- |
| Base Unit | 4-Lut | 2-input Adder | DSP fabric may be based on adders |
| Pipelining | Light (less than 1FF/4-Lut) | High (greater than 1FF/4-LUT) | DSPs require more registers |
| Typical Fanin | 4:1 | 2:1 | DSP fabric may be optimized for fanout |
| Fabric Speed Req. | Less than 300 MHz | As fast a possible | DSP fabric may benefit from greater than speed |
| Resource Sharing | Low | High | DSP fabric may benefit from resource sharing |
| Word Size | 1 bit | 8-64 bits | DSP fabric may benefit from word based interconnects |
| Typical Critical Path | FIFO, MUX or SM | Adder | DSP fabric needs faster adders |
| Operations Grouping | Singular | Vectors | DSP fabric may be optimized for vector operations |

The various embodiments of the CAB improve the density and frequency of the fabric for common arithmetic operations. Table 2 below lists the density improvements for common operations for a CAB compared to a conventional CLB, where additional input registers to pipeline inputs required for CLBs are not reflected in Table 2.

TABLE 2

| Operation | Description | Nclb | Ncab | Fclb (MHz) | Fcab (MHz) |
|---|---|---|---|---|---|
| ADDSUB16 | A 16 bit addition | 2 | 1 | 150 | 300 |
| ADDSUB12 | A 32 bit addition | 4 | 2 | 150 | 300 |
| SUM16X4 | Add 4 16-bit numbers to 18-bit result | 6 | 2-3 | 150 | 300 |
| SAD8X12 ACC | Sum of 2 8-bit absolute differences with 16-bit accumulation | 5 | 1-2 | 150 | 300 |
| MULT8 | 8-bit signed/unsigned multiply | 10 | 1-2 | 150 | 300 |
| MULT16 | 16 bit signed multiply | ~40 | 4 | 150 | 300 |
| MUX32:8 | 32 to 8 bit multiplexer | 2 | 1 | 150 | 300 |
| 4LUTX4 | 8 4:1 LUTs | 1 | 1 | 150 | 300 |
| MEM16X4 | 4 elements 16-bit wide memory | 2-4 | 1 | 150 | 300 |
| DLY16X4 | 4 deep 16-bit wide delay | 2-4 | 1 | 150 | 300 |
| LOP16 | 2-input logical operator | 2 | 1 | 150 | 300 |
| SHIFT32 | 32 bit shift down | 20 | 4-6 | 150 | 300 |
| SELOPS | Selects between 2 different 8-bit operations a + b or c + d | 3 | 1 | 150 | 300 |

Figure 2:
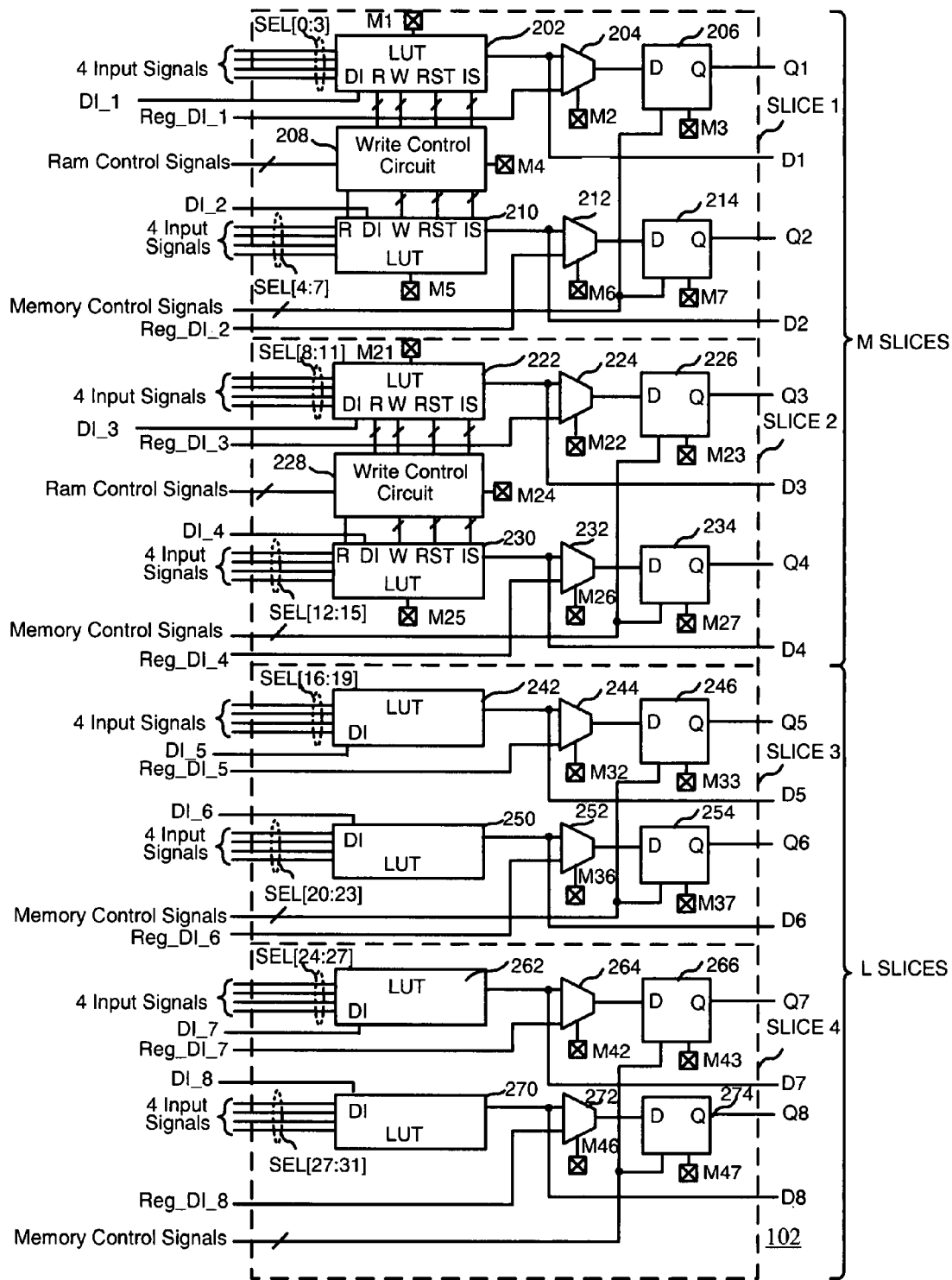
FIG. 2 is a block diagram of a configurable logic element of a configurable logic block of the programmable logic device of FIG. 1 according to an embodiment of the present invention.

While the CAB, which will be described in more detail below, may be approximately 30% larger than a conventional CLB, significant improvements in the overall size to implement a given circuit and operating speed may be achieved by implementing the CAB, as can be seen in FIG. 2.

Turning now to FIG. 2, a block diagram of a configurable logic element of a configurable logic block of the programmable logic device of FIG. 1 is shown. In particular, the simplified configurable logic element of a configurable logic block 102 of FIG. 1 comprises 4 slices, where each slice comprises a pair of function generators. A slice 1 and slice 2 comprise memory slices (or M slices). Each function generator of the M slices may comprise a lookup table which may function in any of several modes depending upon the configuration data in the configuration memory elements which are designated by M and a corresponding number. According to one embodiment, each function generator may be implemented as a lookup table (LUT). The lookup tables of the M slices may be configured as a Random Access Memory (RAM). When in RAM mode, as selected by the memory element M1, input data is supplied by an input terminal DI_1 of slice 1 to the data input (DI) terminal of the associated function generator. In contrast, slice 3 and slice 4 may comprise logic slices (or L slices) which only enable the operation of a lookup table, and not a RAM. Each function generator provides an output signal to an associated multiplexer, which selects between the output signal of the lookup table and an associated register direct input (Reg_Dx) signal from the programmable interconnect element. Thus, each function generator may be optionally bypassed. The LUT 202 receives 4 input select signals SEL[0:3] which are decoded to generate an output D1 associated with data stored in the LUT at the address designated by the input signals SEL[0:3]. The values of the memory elements may be established by the data downloaded as a part of a configuration bitstream, or may be variable data which are dynamically set during the operation of the PLD. A multiplexer 204 is adapted to receive the output of LUT 202 and a registered input value Reg_DI_1. The output of the multiplexer 204 is determined by the memory element M2 and is coupled to a register 206 which is controlled by a memory element M3, which may be an enable signal, to generate a registered output Q1.

A Write Control Circuit 208, which is responsive to the memory element M4, is coupled to receive RAM control signals and generate signals to operate the LUT 202 as a RAM. The memory element M4 may comprise, for example, an enable signal for enabling the application of read and write control signals for enabling the function generator 202 to function as a RAM. In addition to a data input (DI) coupled to receive DI_1 and conventional read and write control signals coupled to a read enable input (R) and a write enable input (W), the LUT 202 comprises a partial reset (RST) input for receiving a partial reset signal, and an initial state (IS) input for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 210 controlled by a memory element M5 and coupled to a multiplexer 212 which is controlled by memory element M6. The LUT 210 is adapted to receive input signals SEL[4:7], while the multiplexer 212 is coupled to receive the output D2 of the LUT 210 and a registered input value Reg_DI_2. The output of the multiplexer 212 is determined by the memory element M6 and is coupled to a register 214 which is configured based upon a memory element M7 to generate an output Q2. The write control circuit 208 also generates a partial reset signal and an initial state signal for selectively resetting or setting one or more of the bits of the LUT 210.

Similarly, slice 2 comprises a function generator implemented as a LUT 222 controlled by a memory element M21 and coupled to a multiplexer 224. In particular, the LUT 222 receives 4 input signals SEL[8:11] which are decoded to generate an output D3 associated with data stored in the LUT at the address designated by the input signals. The multiplexer 224 is adapted to receive the output of LUT 222 and a registered input value Reg_DI_3. The output of the multiplexer 224 is determined by the memory element M22 and is coupled to a register 226 which is controlled by a memory element M23 to generate an output Q3. A Write Control Circuit 228, which is responsive to the memory element M24, is coupled to receive RAM control signals and generate signals to control the LUT 222. Slice 2 further comprises a function generator implemented as a LUT 230 controlled by a memory element M25 and coupled to a multiplexer 232 which is controlled by memory element M26. The LUT 230 is adapted to receive input signals SEL[12-15], while the multiplexer 232 is coupled to receive the output D4 of the LUT 230 and a registered input value Reg_DI_4. The output of the multiplexer 232 is coupled to a register 234 which is configured based upon a memory element M27 generates an output Q4.

The logic LUTs of slices 3 and 4 do not include a write control circuit because they only function as lookup tables and not RAMs. In particular, slice 3 comprises a function generator implemented as a LUT 242 coupled to a multiplexer 244. The LUT 242 receives a data input signal DI_5, and 4 input signals SEL[16:19] which are decoded to generate an output D5 associated with data stored in the LUT at the address designated by the input signals. The multiplexer 244 is adapted to receive the output of LUT 242 and a registered input value Reg_DI_5. The output of the multiplexer 244 is determined by the memory element M32 and is coupled to a register 246 which is controlled by a memory element M33 to generate an output Q5. Slice 3 also comprises a function generator implemented as a LUT 250 coupled to a multiplexer 252. The LUT 250 receives a data input signal DI_6, and 4 input signals which are decoded to generate an output D6 associated with data stored in the LUT at the address designated by the input signals SEL[20-23]. The multiplexer 252 is adapted to receive the output of LUT 250 and a registered input value Reg_DI_6. The output of the multiplexer 252 is determined by the memory element M36 and is coupled to a register 254 which is controlled by a memory element M37 to generate an output Q6.

Similarly, slice 4 comprises a function generator implemented as a LUT 262 and coupled to a multiplexer 264. In particular, the LUT 262 receives a data input signal DI_7, and 4 input signals SEL[24-27] which are decoded to generate an output associated with data stored in the LUT at the address designated by the input signals. The multiplexer 264 is adapted to receive the output of LUT 262 and a registered input value Reg_DI_7. The output of the multiplexer 264 is determined by the memory element M42 and is coupled to a register 266 which is controlled by a memory element M43 to generate an output Q7. Slice 4 also comprises a function generator implemented as a LUT 270 coupled to a multiplexer 272. The LUT 270 receives the data input signal DI_8, and 4 input signals SEL[27:31] which are decoded to generate an output D8 associated with data stored in the LUT at the address designated by the input signals. The multiplexer 272 is adapted to receive the output of LUT 270 and a registered input value Reg_DI_5. The output of the multiplexer 272 is determined by the memory element M46 and is coupled to a register 274 which is controlled by a memory element M47 to generate an output Q8. Although the L slices are designated as logic slices which only functions as lookup tables, all of the slices of the circuit of FIG. 2 may comprise M slices which may also function as a RAM.

Figure 3:
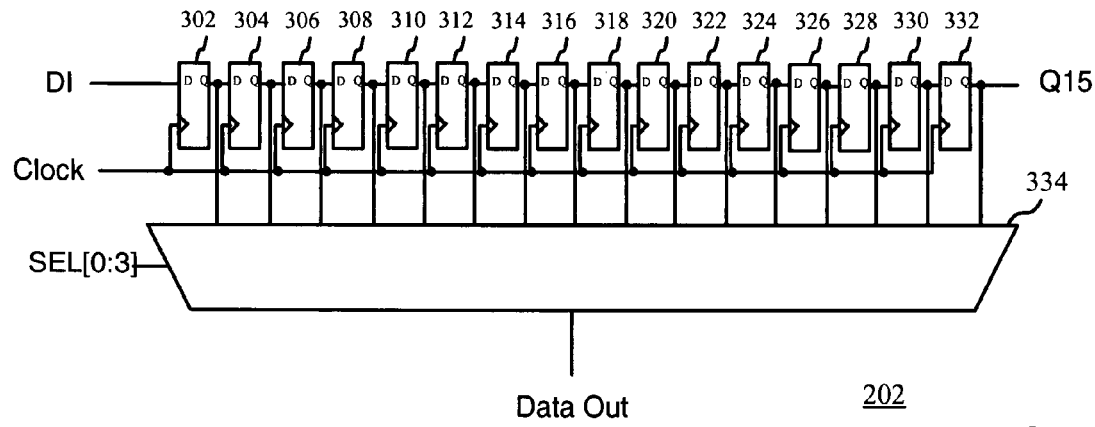
FIG. 3 is a block diagram of an implementation of a lookup table of a configurable logic element of FIG. 2 according to an embodiment of the present invention.

Turning now to FIG. 3, a block diagram of an implementation of a lookup table of a configurable logic element of FIGS. 1 and 2 according to an embodiment of the present invention is shown. The lookup table of FIG. 3 comprises a shift register having sixteen registers 302-332 coupled to serially receive the input data DI. The output of each of the registers is coupled to a multiplexer 334. The output Data Out of the multiplexer is selected based upon a 4 bit input signal SEL[3:0]. As will be described in more detail below, the lookup table of the CLBs may be modified to enable the operation of word based architecture of a PLD implementing a CAB.

Figure 4:
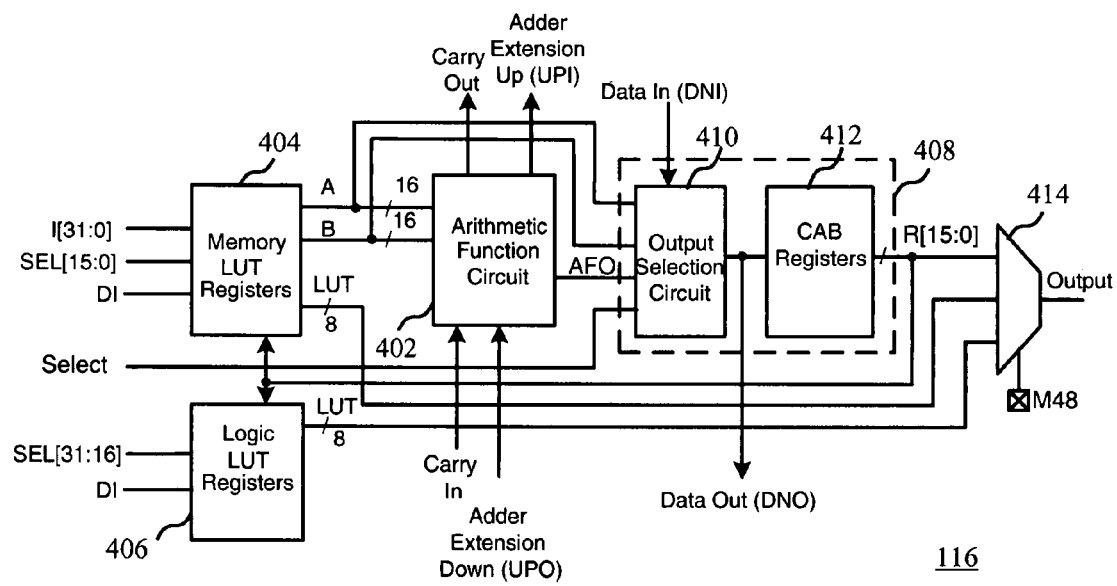
FIG. 4 is a block diagram of the configurable arithmetic block of the programmable logic device of FIG. 1 according to an embodiment of the present invention.

Turning now to FIG. 4, a block diagram of a CAB of the programmable logic device of FIG. 1 according to an embodiment of the present invention is shown. The CAB comprises an arithmetic function circuit 402 coupled to receive outputs A and B of an M LUT register 404. The MLUT 404 is coupled to receive a 32-bit input word I[31:0] and a 16 bit selection word SEL[15:0]. The M LUT 404 also generates an 8-bit LUT output which will be described in more detail below. The most significant sixteen bits I[31:16] are also coupled to an L LUT 406 which also outputs an 8-bit LUT output. Each of the LUTs receives a data input signal DI. While the various 8 and 16 bit output words are shown by way of example, the outputs may comprise other word sizes. As will be described in more detail below in reference to FIG. 5, a modification to the CLB of FIG. 3 enables the creation of a CAB by re-arranging the multiplexing, and by providing arithmetic units and registers in order to support standard word level arithmetic operations such as an add(a,b) function where a and b are 8-bit or 16-bit words. The circuit of FIG. 4 adds features to support standard arithmetic operations in such a way as to utilize existing CLB resources without effecting existing operating modes. The CAB natively supports common arithmetic operations such as add, subtract, multiply, shift and multiplex, while the actual hardware circuit architecture to implement these operations is not exposed to the user, and may be changed in future devices while still supporting these operations. As will be described in more detail in reference to FIG. 8, custom arithmetic fabric is used to increase the density of these operations. Further, the performance of these operations is increased by adding modified LUTs to act as input registers and by using word-based carry techniques. Local interconnects between CABs are also used to extend the word width of some arithmetic operations.

The outputs A and B are also coupled to output register 408 comprising an output selector 410, which is also coupled to an arithmetic fabric output AFO of the arithmetic function circuit. The output will also receive a data input (DNI) signal from an adjacent CAB. The output selection circuit 410 will generate, based upon a selection signal, a data out (DNO) signal which is coupled to CAB output registers 412 of the output register. The selection signal may comprise an input from a memory element as will be described in more detail below. The CLB of FIG. 2 having 48 inputs and 16 outputs may be modified by adding 8 additional output registers. For example, the CAB output registers 412 may comprise a 16-bit wide register. Finally, an output multiplexer 414 is coupled to receive a registered output R[0:15] of the CAB registers, an 8-bit word output of the M LUT 404, and an 8-bit word output of the L LUT 406. The output of the multiplexer is selected by an memory element M48. Finally, local interconnections to adjacent CABs to enable communication between the CABs. As will be described in more detail below, the arithmetic function circuit will receive a Carry In signal from a first adjacent CLB and generate a Carry Out signal to a second adjacent CAB. The Carry In and Carry Out signals enable carry functions by the CAB. Similarly, Adder Extension Down (UPO) and Adder Extension Up (UPI) signals enable the use of unused logic elements of adjacent CABs. The output selection circuit 410 may also receive data by way of a Data_In (DNI) input or generate data by way of a Data_Out (DNO) output.

The use of the local interconnections to adjacent CABs of FIG. 4 provides for arbitrary word size. DSP operations tend to be smoothly scalable in word width, yet word oriented architectures tend to be inefficient when implementing word sizes which are not multiples of the unit word size. As will be described in more detail below, the circuit of FIG. 4 addresses this inefficiency by retaining bit level operations based on LUTs which may be combined with word oriented arithmetic operations to efficiently implement odd sized words such as 1-bit or 9-bit words. The circuit of FIG. 4 also utilizes direct interconnections between arithmetic blocks to allow smooth growth in word width beyond the basic word width unit. A word-oriented interconnect pattern reduces the configuration memory requirements, as well as the total depth of necessary interconnect multiplexing, reducing the cost of the interconnections of the FPGA. Because special case circuits when implemented in configurable logic often go unused, the circuit of FIG. 4 allows the arithmetic fabric to be borrowed by an adjacent unit if it is used for overflow bits or to extend the precision of multipliers. Latency associated with arithmetic functions may be reduced by cascading arithmetic elements together in such a way as to obtain four sequential additions in a single clock.

Figure 5:
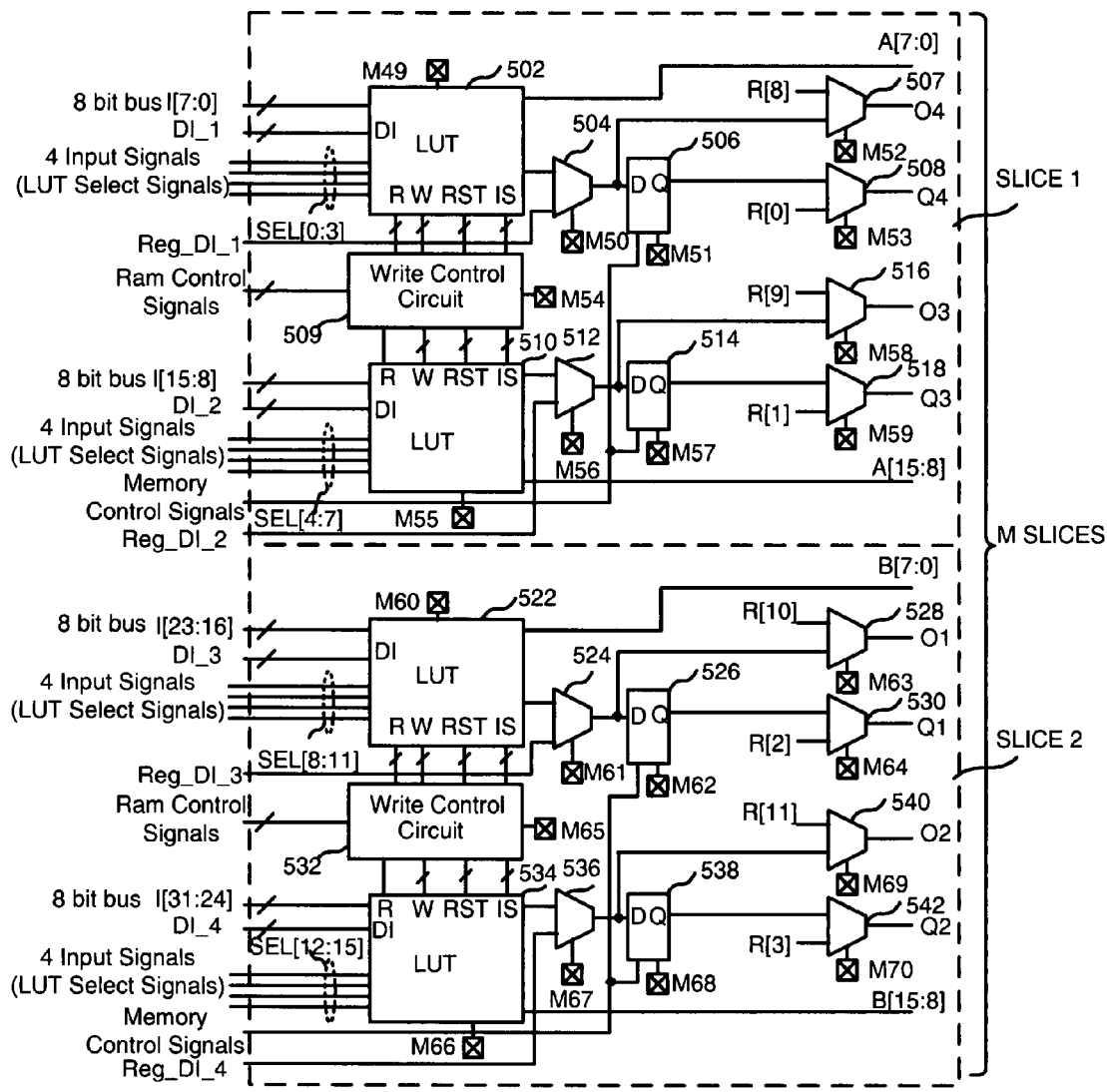
FIG. 5 is a block diagram of memory lookup table registers of the configurable arithmetic block of the FIG. 4 according to an embodiment of the present invention.

Turning now to FIG. 5, a block diagram of memory lookup table registers of the configurable arithmetic block of the FIG. 4 according to an embodiment of the present invention is shown. In particular, slice 1 comprises a LUT 502, the function of which is controlled by a memory element M49. In addition to receiving the LUT selections signals as in a CLB, the LUT 502 of a CAB also receives an 8-bit bus I[7:0] as a data input. The LUT 502 also generates an 8-bit output word A[7:0] and a single bit stored in memory element of the LUT selected by the LUT select signals SEL[0:3]. A single bit output of the LUT 502 is coupled to a multiplexer 504, which is also coupled to receive registered data input word Reg_DI_1. The generation of the single bit output will be described in more detail in reference to an embodiment of the LUT of FIG. 6. The input selected to be the output of multiplexer 504 is controlled by a memory element M50. The output of the multiplexer 504 is coupled to a register 506 which is configured based upon value of a memory element M51 and which generates a registered value of the single bit output of the LUT 504. An output multiplexer 507 is coupled to receive R[8], which is an output of the CAB registers 412 and the output of multiplexer 504 as inputs, and generates an output O4 based upon the memory value M52. A second output multiplexer 508 is coupled to receive the output of register 506 and R[0], and generates a value Q4 based upon the memory element M53.

A Write Control Circuit 509 is coupled to receive RAM control signals and generate signals to control the LUT 502. The write control circuit 509 is also responsive to the memory element M54. In addition to conventional read and write control signals coupled to a read enable input (R) and a write enable input (W), the LUT 509 comprises a partial reset (RST) input for receiving a partial reset signal, and an initial state (IS) input for receiving an initial state signal. Slice 1 further comprises a LUT 510, the function of which is controlled by a memory element M55. In addition to receiving the LUT selections signals as in a CLB, the LUT 510 also receives an 8-bit bus I[15:8] as a data input. The LUT 510 also outputs an 8-bit output word A[15:8] and generate a single bit output selected by the LUT select signals SEL[4:7]. The single bit output of the LUT 510 is coupled to a multiplexer 512, which is also coupled to receive registered data input word Reg_DI_2. The input selected to be output by the multiplexer 512 is controlled by a memory element M56. The output of the multiplexer is coupled to a register 514 which is configured based upon a memory element M57 and which generates a registered value. An output multiplexer 516 is coupled to receive R[9] and the output of multiplexer 512 as an input, and generate an output O3 based upon the memory value M58. A second output multiplexer 518 is coupled to receive the output of register 514 and R[1], and generate output a value Q3 based upon the memory element M59. As can be seen, slice 1 generates a 16-bit output word A[15:0], compared to 4 output bits of an M slice of the CLB described in FIG. 2.

Further, slice 2 comprises a LUT 522, the function of which is controlled by a memory element M60. In addition to receiving the LUT selections signals SEL[8:11] as in a CLB, the LUT 522 also receives an 8-bit bus SEL[23:16] as a data input. The LUT 522 also outputs an 8-bit output word B[7:0] and a single bit output selected by the LUT select signals. The single bit output of the LUT 522 is coupled to a multiplexer 524, which is also coupled to receive registered data input word Reg_DI_3. The input selected to be output by the multiplexer 524 is controlled by a memory element M61. The output of the multiplexer 524 is coupled to a register 526 which is configured based upon value of a memory element M62 and which generates a single bit output. An output multiplexer 528 is coupled to receive R[10] and the output of multiplexer 524 as an input, and generate an output O1 based upon the memory value M63. A second output multiplexer 530 is coupled to receive the registered output of register 526 and R[2], and output a value Q1 based upon the memory element M64.

A Write Control Circuit 532 is coupled to receive RAM control signals and generate signals to control the LUT 522. The write control circuit 532 is also responsive to the memory element M65. In addition to conventional read and write control signals coupled to a read enable input (R) and a write enable input (W), the LUT 522 comprises a partial reset (RST) input for receiving a partial reset signal, and an initial state (IS) input for receiving an initial state signal. Slice 1 further comprises a LUT 534, the function of which is controlled by a memory element M66. In addition to receiving the LUT selections signals, the LUT 534 also receives an 8-bit bus I[31:24] as a data input. The LUT 534 also outputs an 8-bit output word B[15:8] and a single bit output selected by the LUT select signals SEL[12:15]. The single bit output of the LUT 534 is coupled to a multiplexer 536 which is also coupled to receive registered data input word Reg_DI_4. The input selected to be output by the multiplexer 536 is controlled by a memory element M67. The output of the multiplexer 536 is coupled to a register 538 which is configured based upon a memory element M68. An output multiplexer 540 is coupled to receive R[11] and the output of multiplexer 536 as an input, an generates an output O2 based upon the memory value M69. A second output multiplexer 542 is coupled to receive the output of register 538 and R[3], and generate a value Q2 based upon the memory element M70.

Figure 6:
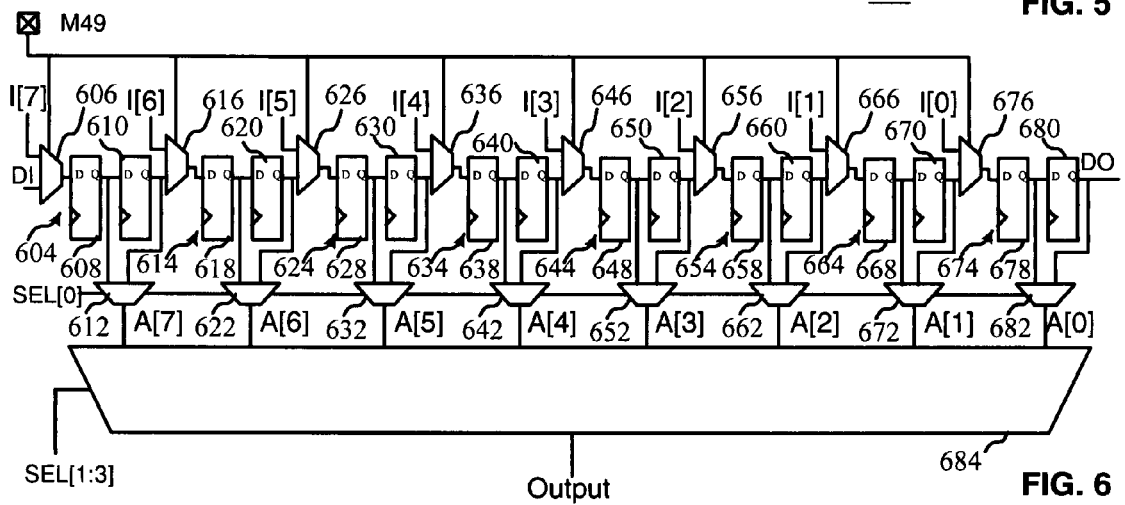
FIG. 6 is a block diagram of an implementation of a lookup table of the memory lookup table registers of FIG. 5 according to an embodiment the present invention.

Turning now to FIG. 6, a block diagram of an implementation of a lookup table of the memory lookup table registers of FIG. 5 according to an embodiment the present invention is shown. The LUTs of the M slice, such as LUT 502 for example, is configured to enable receiving an 8 bit input word I[7:0] in parallel and generate the 8-bit output word A[7:0]. Depending upon the mode of operation, the LUT may function as a shift register for receiving a serial input data stream DI, or receive the 8-bit input word comprising data to be processed. In particular, a first stage 604 of the LUT comprises a multiplexer 606 coupled to receive the input data stream DI at a first input and the most significant bit I[7] of the input data bus. The output of the multiplexer 606 is coupled to a first register 608. The output of the first register is coupled to a second register 610 and a first input of a multiplexer 612. The output of the second register 610 is coupled to a second input of the multiplexer 612. A selection signal determines which output of the multiplexer 612 is selected. While each stage comprises the same configuration, the second and subsequent stages receive as an input to a multiplexer the output of a previous stage and a different bit of the input word I[7:0].

In particular, a second stage 614 of the LUT comprises a multiplexer 616 coupled to receive the output of a previous stage at a first input and the bit I[6] of the input data bus at a second input. The output of the multiplexer 616 is coupled to a first register 618. The output of the first register 618 is coupled to a second register 620 and a first input of a multiplexer 622. The output of the second register 620 is coupled to a second input of the multiplexer 622. A selection signal determines which output of the multiplexer 622 is selected. A third stage 624 of the LUT comprises a multiplexer 626 coupled to receive the output of the previous stage at a first input and the bit I[5] of the input data bus at a second input. The output of the multiplexer 626 is coupled to a first register 628. The output of the first register 628 is coupled to a second register 630 and a first input of a multiplexer 632. The output of the second register 630 is coupled to a second input of the multiplexer 632. A fourth stage 634 of the LUT comprises a multiplexer 636 coupled to receive the output of the previous stage at a first input and the bit I[4] of the input data bus at a second input. The output of the multiplexer 636 is coupled to a register 638. The output of the first register 638 is coupled to a second register 640 and a first input of a multiplexer 642. The output of the second register 640 is coupled to a second input of the multiplexer 642. A fifth stage 644 of the LUT comprises a multiplexer 646 coupled to receive the output of the previous stage at a first input and the bit I[3] of the input data bus at a second input. The output of the multiplexer 646 is coupled to a first register 648. The output of the first register 648 is coupled to a second register 650 and a first input of a multiplexer 652. The output of the second register 650 is coupled to a second input of the multiplexer 652. A sixth stage 654 of the LUT comprises a multiplexer 606 coupled to receive the output of the previous stage at a first input and the bit I[2] of the input data bus at a second input. The output of the multiplexer 656 is coupled to a first register 658. The output of the first register 658 is coupled to a second register 660 and a first input of a multiplexer 662. The output of the second register 660 is coupled to a second input of the multiplexer 662. A seventh stage 664 of the LUT comprises a multiplexer 666 coupled to receive the output of the previous stage at a first input and the bit I[1] of the input data bus at a second input. The output of the multiplexer 666 is coupled to a first register 668. The output of the first register 668 is coupled to a second register 670 and a first input of a multiplexer 672. The output of the second register 670 is coupled to a second input of the multiplexer 672. A selection signal SEL[1:3] determines which output of the multiplexer 672 is selected.

Finally, an eighth stage 674 of the LUT comprises a multiplexer 676 coupled to receive the output of the previous stage at a first input and the bit I[0] of the input data bus at a second input. The output of the multiplexer 676 is coupled to a first register 678. The output of the first register 678 is coupled to a second register 680 and a first input of a multiplexer 682. The output of the second register 680 is coupled to a second input of the multiplexer 682. A selection signal determines which output of the multiplexer 682 is selected. The output of the eighth stage comprises a DO signal. The outputs of the multiplexers are coupled to an output multiplexer 684 which receives selection signals SEL[1:3] to select one of the output bits A[0] to A[7]. The selection signal for selecting the input to each stage may be provided by a memory element M49 for example. As can be seen, the LUTs of FIG. 6 enable (i) the receiving of a serial data stream DI and generation of the output data stream DO, (ii) the generation of an 8-bit word A7[:0], or (iii) the selection and output of a single bit of the 8-bit word. The selection signal M49 determines whether data of the 8-bit data bus or serial data is output by the LUT.

The additional multiplexers of the M-slice increase the internal word-width of the LUT memory from 4-bits by 16-bits, and increase the number of read and write ports from 1 to 2. This modification of the memory LUTs allows the LUT memory to be used as a 16-bit data source to an internal arithmetic unit which is 16-bits wide. This modification also allows the M LUT to serve as a dual 16-bit input register, a 2-deep delay memory or a 2 element memory. As will be described in more detail below, the addition of an arithmetic function circuit connected to the read ports of the M LUTs comprise a number of adders which may be configured to support multiple interconnect patterns by judicious use of input multiplexers. The number of adders and multiplexers is determined by the mathematical operators which are supported and the density required for each operator. The use of local connections between arithmetic units in adjacent CLBs supports word widths greater than the internal word sizes of 8 and 16-bits. The addition of CAB output registers increases the number of registered outputs from 8 to 16. As will be described in more detail in reference to FIG. 7, the addition of multiplexers enable reading out a 16-bit field from the L LUTs. Accordingly, up to 4 instructions may be selected by a 2-bit control field.

Figure 7:
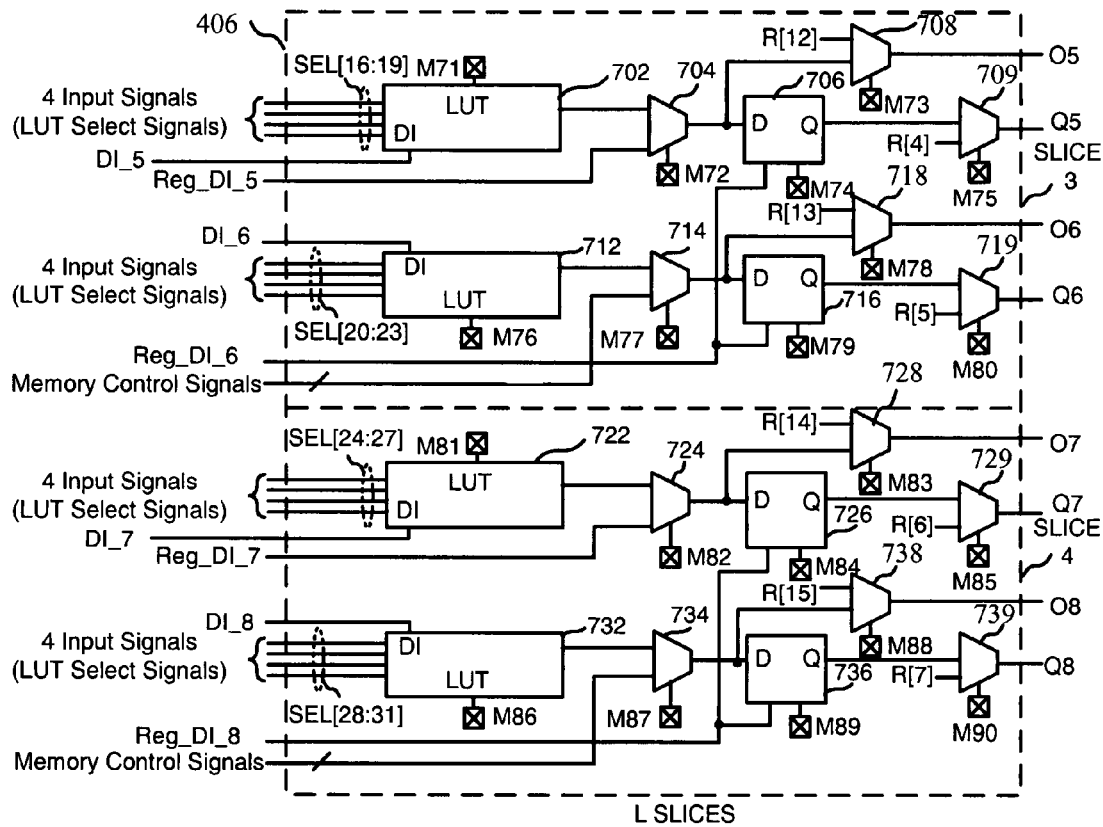
FIG. 7 is a block diagram of logic lookup table registers of the configurable arithmetic block of the FIG. 4 according to an embodiment of the present invention.

Turning now to FIG. 7, a block diagram of logic lookup table registers of the configurable arithmetic block of the FIG. 4 according to an embodiment of the present invention is shown. In particular, slice 3 comprises a function generator implemented as a LUT 702 coupled to a multiplexer 704. The LUT 702 controlled by memory element M71 receives 4 input signals SEL[16-19] which are decoded to generate an input coupled to a multiplexer 704. The multiplexer 704 which is also coupled to receive a registered input Reg_DI_5. The output of the multiplexer 704, which is selected based upon a value of M72, is coupled to a multiplexer 708. The output of the multiplexer 704 and a value R[12] is selected by the multiplexer 708 as output O5 based upon a value of memory element M73. The output of the multiplexer 704 is also coupled to a register 706 which is configured based upon the value of the memory element 74. The output of the register 706 and a value R[4] are coupled to a multiplexer 709, the output of which is selected by a value of a memory element M75 to generate a value of Q5. Slice 3 further comprises a function generator implemented as a LUT 712 coupled to a multiplexer 714. The LUT 712 controlled by memory element M76 receives 4 input signals SEL[20-23] which are decoded to generate an input coupled to a multiplexer 714 which is also coupled to receive a registered input Reg_DI_6. The output of the multiplexer 714, which is selected based upon a value of M77, is coupled to a multiplexer 718. The output of the multiplexer 714 and a value R[13] is selected by the multiplexer to generate output O6 based upon a value of memory element M78. The output of the multiplexer 714 is also coupled to a register 716 which is configured based upon the value of the memory element M79. The output of the register 716 and a value R[5] are coupled to a multiplexer 719, the output of which is selected by a value of a memory element M80 to generate a value of Q6.

Further, slice 4 comprises a function generator implemented as a LUT 722 coupled to a multiplexer 724. The LUT 722 controlled by memory element M81 receives 4 input signals SEL[24-27] which are decoded to generate an input coupled to the multiplexer 724. The multiplexer 724 is also coupled to receive a registered input Reg_DI_7. The output of the multiplexer 724, which is selected based upon a value of M82, is coupled to a multiplexer 728. The output of the multiplexer 724 and a value R[14] is selected by the multiplexer based upon a value of memory element M83. The output of the multiplexer 724 is also coupled to a register 726 which is configured based upon the value of the memory element M84. The output of the register 726 and a value R[6] are coupled to a multiplexer 729, the output of which is selected by a value of a memory element M85 to generate a value of Q7. Slice 4 further comprises a function generator implemented as a LUT 732 coupled to a multiplexer 734. The LUT 732 controlled by memory element M86 receives 4 input signals SEL[28-31] which are decoded to generate an input coupled to a multiplexer 734 which is also coupled to receive a registered input Reg_DI_8. The output of the multiplexer 734, which is selected based upon a value of M87, is coupled to a multiplexer 738. The output of the multiplexer 734 and a value R[15] is selected by the multiplexer based upon a value of memory element M88. The output of the multiplexer 734 is also coupled to a register 736 which is configured based upon the value of the memory element M89. The output of the register 736 and a value R[7] are coupled to a multiplexer 739, the output of which is selected by a value of a memory element M90 to generate a value of Q8.

Although the area of a CAB described in FIGS. 5-7 may be increased compared to a CLB described in FIGS. 2-3 by approximately 30%, the arithmetic density and the arithmetic speed may be doubled. A significant advantage of the circuits of FIGS. 1-7 is to add additional arithmetic capability by implementing a CAB which has the same number of input and output ports as a CLB. This is done by using the current 32 LUT inputs as data inputs to 16×1-bit memories reconfigured to act as 2×8-bit memories, and using the current 8 registered and 8 un-registered outputs as outputs from a 16-bit register. The following Table 3 shows how the signal set for the CLB of FIG. 2 may also be used in an arithmetic mode. That is, these same inputs and outputs are routed to additional ports of FIGS. 5 and 7 are shown in Table 3.

| CLB Input/ Output port (FIG. 2) | CLB function (FIG. 2) | Arithmetic mode signal (FIGS. 5, 7) | Arithmetic mode register name (FIG. 4) |
|---|---|---|---|
| DI_1 | Q1 input | I[0] | A[0] |
| SEL[0] | LUT1 input | SEL[0] | |
| SEL[1] | LUT1 input | I[1] | A[1] |
| SEL[2] | LUT1 input | I[2] | A[2] |
| SEL[3] | LUT1 input | I[3] | A[3] |
| DI_2 | Q2 input | I[4] | A[4] |
| SEL[4] | LUT2 input | SEL[4] | |
| SEL[5] | LUT2 input | I[5] | A[5] |
| SEL[6] | LUT2 input | I[6] | A[6] |
| SEL[7] | LUT2 input | I[7] | A[7] |
| DI_3 | Q3 input | I[8] | A[8] |
| SEL[8] | LUT3 input | SEL[8] | |
| SEL[9] | LUT3 input | I[9] | A[9] |
| SEL[10] | LUT3 input | I[10] | A[10] |
| SEL[11] | LUT3 input | I[11] | A[11] |
| DI_4 | Q4 input | I[12] | A[12] |
| SEL[12] | LUT4 input | SEL[12] | |
| SEL[13] | LUT4 input | I[13] | A[13] |
| SEL[14] | LUT4 input | I[14] | A[14] |
| SEL[15] | LUT4 input | I[15] | A[15] |
| DSEL_5 | Q5 input | I[16] | B[0] |
| SEL[16] | LUT4 input | | |
| SEL[17] | LUT5 input | I[17] | B[1] |
| SEL[18] | LUT5 input | I[18] | B[2] |
| SEL[19] | LUT2 input | I[19] | B[3] |
| DSEL_6 | Q6 input | I[20] | B[4] |
| SEL[20] | LUT6 input | | |
| SEL[21] | LUT6 input | I[21] | B[5] |
| SEL[22] | LUT6 input | I[22] | B[6] |
| SEL[23] | LUT6 input | I[23] | B[7] |
| DSEL_7 | Q7 input | I[24] | B[8] |
| SEL[24] | LUT7 input | | |
| SEL[25] | LUT7 input | I[25] | B[9] |
| SEL[26] | LUT7 input | I[26] | B[10] |
| SEL[27] | LUT7 input | I[27] | B[11] |
| DI_8 | Q8 input | I[28] | B[12] |
| SEL[28] | LUT8 input | | |
| SEL[29] | LUT8 input | I[29] | B[13] |
| SEL[30] | LUT8 input | I[30] | B[14] |
| SEL[31] | LUT8 input | I[31] | B[15] |
| Q1 | Q1 output | Q1 | R[0] |
| Q2 | Q2 output | Q2 | R[1] |
| Q3 | Q3 output | Q3 | R[2] |
| Q4 | Q4 output | Q4 | R[3] |
| Q5 | Q5 output | Q5 | R[4] |
| Q6 | Q6 output | Q6 | R[5] |
| Q7 | Q7 output | Q7 | R[6] |
| Q8 | Q8 output | Q8 | R[7] |
| D1 | LUT1 output | O1 | R[8] |
| D2 | LUT2 output | O2 | R[9] |
| D3 | LUT3 output | O3 | R[10] |
| D4 | LUT4 output | O4 | R[11] |
| D5 | LUT5 output | O5 | R[12] |
| D6 | LUT6 output | O6 | R[13] |
| D7 | LUT7 output | O7 | R[15] |
| D8 | LUT8 output | O8 | R[15] |

Accordingly, the same number of input and output ports of a CLB of FIG. 2 is used for a CAB to provide wider data word outputs, which is beneficial in DSP applications.

Figure 8:
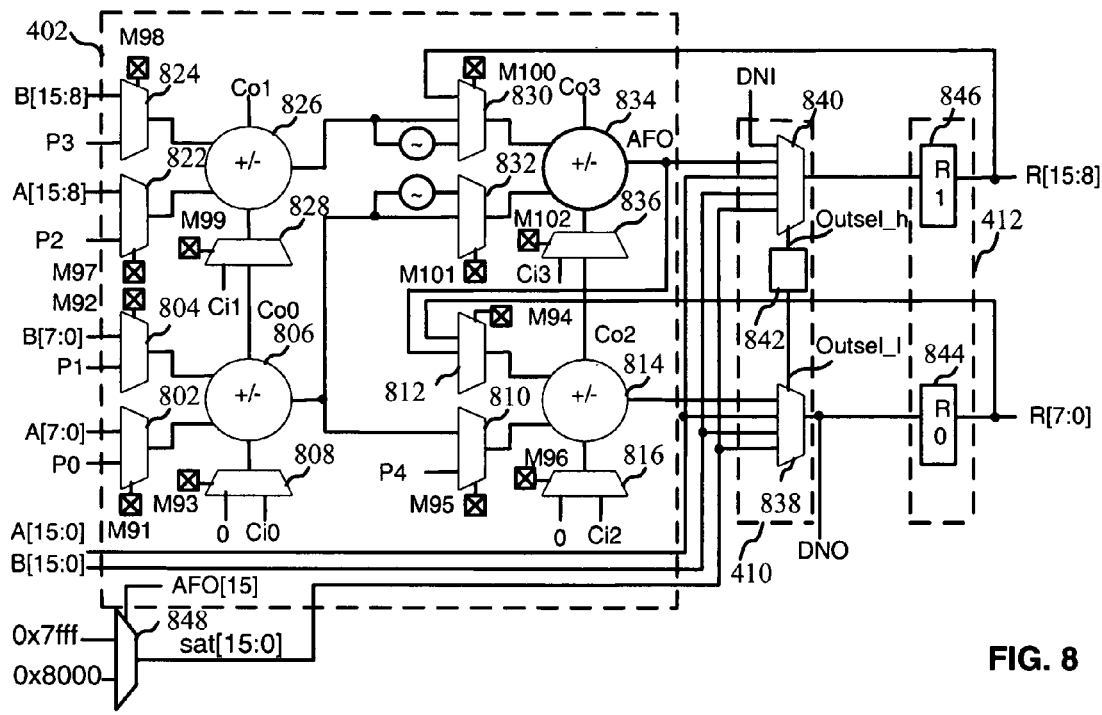
FIG. 8 is a block diagram of the arithmetic function circuit of the configurable arithmetic block of FIG. 4 according to an embodiment of the present invention.

Turning now to FIG. 8, a block diagram of the arithmetic function circuit of the configurable arithmetic block of FIG. 4 according to an embodiment of the present invention is shown. In particular, while examples of the M LUT and L LUT circuits have been shown in FIGS. 5-7, a more detailed block diagram of the arithmetic function circuit 402, the output selector 410, and output register 412 according to one embodiment of the invention in FIG. 8 is shown. A first multiplexer 802 is coupled to receive A[7:0] and P0 at its inputs, the output of which is controlled by a memory element M91. A second multiplexer 804 is coupled to receive B[7:0] and P1 at its inputs and generate an output based upon a value of M92. The P values represent products generated for a sum of products function implemented by the arithmetic function circuit. The outputs of the multiplexers are coupled to an adder circuit 806. A carry-in multiplexer 808 controlled by a memory element M93 is also coupled to the adder circuit 806 to receive a carry-in from an adjacent CAB. In particular, the carry-in multiplexer 808 receives a carry-in value Ci0 and a logical "0" as inputs. The output of the adder circuit 806 is coupled to a multiplexer 810 which selects between the output of the adder circuit 806 and a value P4. A multiplexer 812 is coupled to select an output (AFO) of the arithmetic function circuit 402 and the output R[7:0] based upon memory value M94. The output of the multiplexer 810, multiplexer 812, and the output of a carry-in multiplexer 816, which is coupled to select either a 0 or a carry-in value Ci2 value based upon a memory element M96, is coupled to an adder circuit 814. As will be described in more detail below, the output of the adder circuit 814 is coupled to the output selector 410.

A multiplexer 822 is coupled to receive A[15:8] and P2 at its inputs, the output of which is controlled by a memory element M97. Another multiplexer 824 is coupled to receive B[15:8] and P3 at its inputs and generate an output based upon a value of M98. The outputs of the multiplexers are coupled to an adder circuit 826. A multiplexer 828 controlled by a memory element M99 is also coupled to the adder circuit 826 and receives a carry-in value of Ci1 and a carry-out value of Co0 from the adder circuit 806. The output of the adder circuit 826 is coupled to a multiplexer 830 which is controlled by a value of M100. A multiplexer 832 is coupled to select the output of the adder circuit 806 based upon a value of M101. The output of the multiplexer 830, multiplexer 832, and the output of a carry-in multiplexer 836, which is coupled to select either a carry-in value Ci3 or a carry-out value Co2 from the adder circuit 814 based upon a memory element 102, is coupled to an adder circuit 834.

Output circuit 410 comprises a first multiplexer 838 coupled to receive the A[15:0] value, the B[15:0] value, a saturation value SAT[15:0], and the output of the adder circuit 814. The output of the multiplexer 838 comprises an output DNO which may be coupled to an adjacent CAB. In addition to receiving the A[15:0] value, the B[15:0] value, and the saturation value SAT[15:0], a second multiplexer 840 also receives the output AFO of the adder circuit 834. The multiplexers 838 and 840 are controlled by a control circuit 842, which will be described in more detail in reference to FIGS. 9 and 10. The outputs of the multiplexers are coupled to the output register 412 comprising a first register 844, the output of which is the registered value R[7:0], and a second register 846, the output of which is the registered value R[15:8]. Finally, a multiplexer 848 is also coupled to receive 0x7ffff and 0x8000 values. The multiplexer 848 generates the saturation value sat[15:0]. The output of multiplexer 848 depends upon the most significant bit AFO[15] of the AFO signal. Specific implementations of the circuit of FIG. 8 will be described in more detail in reference to other figures below.

Turning now to FIG. 9, a block diagram of an output multiplexer control circuit according to an embodiment of the present invention is shown. As can be seen, the control circuit 842, shown in FIG. 8, comprises a decoder 902 coupled to receive a carry out value Co, AFO[15], A[15], B[15], a select signal, and a mode signal. The decoder generates output select values outsell_h[2:0] and an outsell_l[1:0]. As shown in the table of FIG. 10, the mode selection signal (mode[2:0]) associated with the function of the circuit and inputs, will determine the outsel_h[2:0] and outsell_l[1:0] values. That is, the outsell_h signal is 3 bits generated to select one of the five inputs to the multiplexer 846, while outsel_l is 2 bits generated to select one of the four inputs to the multiplexer 844 based upon the mode select signal and other inputs to the decoder 902. By way of example, if the circuit is in a 16-bit adder to add or subtract 16 bit values based upon the mode select signal alone, the outsel_h[2:0] signal would select AFO and the outsel_i[2:0] would select AFO.

As can be seen in FIGS. 4-10, the circuits address the problem of the abstraction level of conventional programmable logic devices by increasing the input word length, implementing arithmetic functions in an arithmetic function circuit of a CAB, and adding output registers to generate wider output words. Because designers of DSP circuits design their circuits in terms of word operations such as add, subtract, and multiply or other basic operations designated by the standard C-operators {+ − * / << >> & | ! ~}, the circuit of FIG. 8 is intended to support these high level abstractions directly. Accordingly, similar devices with different internal architectures may be used to map the same operations transparently to the user. Further, optimized hardware resources may be matched to the statistical usage found in typical DSP applications. For example, while multipliers are common, adders are more common in typical DSP applications. Similarly, 16-bit words are more common than 64-bit words. The circuit of FIG. 8 addresses the need for different word sizes by supporting arbitrary word sizes, and is optimized to support specific operations and word sizes more efficiently.

The circuit of FIG. 8 may implement a number of different operating modes. For example, a first mode is a 16-bit mode which uses the CLB's 32 data inputs as 2×16-bit words rather than 8×4-bit fields. The output is assumed to be a 16 bit word with bits allocated in a known order. This 16-bit mode improves density for 2:1 fan-in operations. A second mode is an 8-bit mode which uses the CLB's 32 data inputs as 4×8-bit words. The output is assumed to be a 8-bit word with bits allocated in a known order. A third mode is a 4-bit mode which uses the CLB's 32 data inputs 8×4-bit fields as input to 8×4-LUTs. The output is assumed to be an 8 independent 1-bit words. A fourth mode is a mixed mode with some 4-bit input fields being used as LUT inputs, while other 4-bit input fields are used as 8-bit inputs. A shared mode enables the CAB to operate in 8-bit mode and borrows the arithmetic fabric from a neighboring CAB to provide 16 output bits. This mode is particularly useful when supporting overflow bits and multipliers.

The following FIGS. 11-20 show specific configurations of the circuit of FIG. 8 implementing different modes. In the event that multiple CABs are necessary to implement a given mode, the arrangement of multiple CABs is shown. For example, a block diagram of an implementation of the arithmetic configuration circuit configured in a 16-bit mode is shown in FIG. 11. In order to more clearly show the 16-bit mode, the multiplexers are removed when a certain input is selected. As shown in FIG. 11, the A[7:0], B[7:0] and Ci0 inputs are coupled to the adder circuit 806 which generates an 8 bit output. The carry output Co0 is coupled to the adder circuit 826, which also receives the A[15:8] and B[15:8] as inputs. The adder circuit 814 receives the output of the adder circuit 806, the registered output R[7:0] and the carry-in input Ci2. Finally, the adder circuit 834 receives the output of the adder circuit 826, the carry output Co2 and the registered output R[15:8] to generate the arithmetic fabric output AFO. Accordingly, two sixteen-bit values A and B are added to generate a 16 bit output R[15:0].

Figure 12:
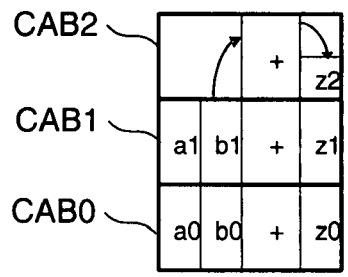
FIG. 12 is a diagram showing 16-bit addition using the circuit of FIG. 11 having 8 bit slices according to an embodiment of the present invention.

As shown in FIG. 12, the circuit of FIG. 11 enables 16-bit addition. Because conventional circuits have low efficiency when adding input multiplexers to operators, the circuit of FIG. 11 addresses this problem by reusing the input multiplexer to select between bytes of the 32-bit input field when operating in 8-bit mode. This allows the input multiplexer to be used to select between one of different inputs for A and B by selecting between one of 2 different instructions. Three CABs may implement the function z[33:0]=x[31:0]+y[31:0], where a carry-in function CAB2 is used to generate z2, the most significant bits of z[33:0], where z0 and z1 comprise 16 bit values.

Figure 13:
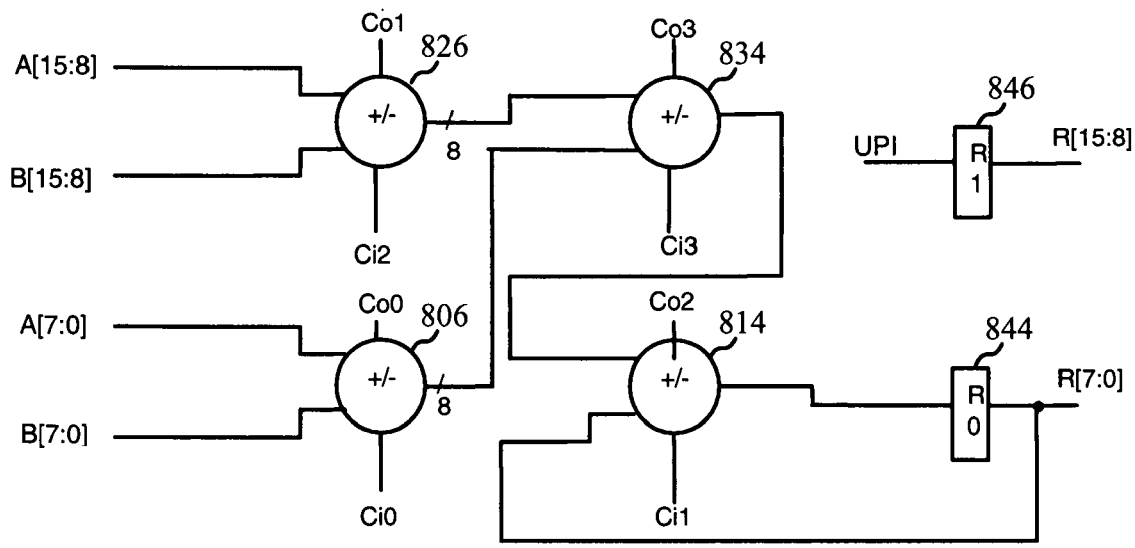
FIG. 13 is a block diagram of an implementation of the arithmetic logic circuit configured in an 8-bit mode according to an embodiment of the present invention.

Turning now to FIG. 13, a block diagram shows an implementation of the arithmetic function circuit configured in an 8-bit mode. In particular, the two 8-bit words A[7:0] and B[7:0] are coupled to the adder circuit 806. The adder circuit 806 also receives the carry-in Ci0 and generates an 8-bit output. The adder circuit 826 receives the inputs A[15:8] and B[15:8] and the carry-in Ci2 to generate a second 8-bit output. The adder circuit 834 receives the outputs of the adder circuits 806 and 826 and the carry-in Ci3. The output of the adder circuit 834 is coupled to the input of the adder circuit 814 which also receives the registered output R[7:0] to generate an 8-bit output when the circuit is in 8-bit mode. Register 846 also receives the UPI input from an adjacent CAB to generate R[15:8].

Figure 14:
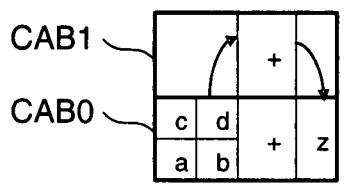
FIG. 14 is a diagram showing adding functions employing 8-bit slices using the circuit of FIG. 13 according to an embodiment of the present invention.

Turning now to FIGS. 14 and 15, diagrams show adding functions in 8-bit and 16-bit slices according to an embodiment of the present invention. In particular, the circuit of FIG. 14 may be used to implement the equation z=a+b+c+d, where the addition function of the upper CAB may be borrowed by the lower CAB in adding the four 8-bit values as shown in FIG. 14. Similarly, 8-bit input words may be used in a configuration of 3 CABs as shown where the addition function of the top CAB may be borrowed by the middle CAB to generate z2 according to the equation z210+a10+b10+c10+d10 as shown in FIG. 15.

Turning now to FIG. 16, a block diagram of an implementation of the arithmetic function circuit configured in a multiply slice mode according to an embodiment of the present invention is shown. A first portion of the circuit comprises input multiplexing. In particular, A[7:0], A[15:8], B[7:0] and B[15:8] are coupled to a first multiplexer 1602 which is controlled by a memory element M103. M103 is preferably a dynamic value which is coupled to the multiplexer 1602 to generate the correct product term. The A[15:8] is also provided to a separate CAB as the UPO signal. The 8-bit AO of the multiplexer is coupled to a concatenation circuit 1606 which is also coupled to receive an 8 bit UPI signal from another CAB. The 16 bit output is coupled to shift registers. In particular, a multiplexer 1608 is coupled to receive the output of a shift 0 input and a shift 1 input, a multiplexer 1610 is coupled to receive the output of a shift 2 input and a shift 3 input, a multiplexer 1612 is coupled to receive the output of a shift 4 input and a shift 5 input, a multiplexer 1614 is coupled to receive the output of a shift 6 input and a shift 7 input. The output of the multiplexer 1608 is coupled to a multiplexer 1616 to generate the product term P0. Similarly, the output of the multiplexer 1610 is coupled to a multiplexer 1618 to generate the product term P1. The output of the multiplexer 1612 is coupled to a multiplexer 1620 to generate the signal P2. Finally, the output of the multiplexer 1614 is coupled to a multiplexer 1622 to generate the product term P3. A shift 8 output is coupled to a multiplexer 1624 to generate the product term P4. B [7:0] and B[15:8] are coupled to a second multiplexer 1626 which is controlled by a memory element M104. The output BO of the multiplexer 1626 is coupled to a Booth/shift encoder 1628, which is controlled by M105, to control the multiplexers 1608-1624. As is well known in the art, a Booth encoder reduced the number of partial products generated as a result of multiplication.

The adder circuit 806 receives P0 and P1, while adder circuit 826 receives product terms P2 and P3. The outputs of the adder circuits 806 and 826 are coupled to the adder circuit 834, the output of which is coupled to the adder circuit 814. Adder circuit 814 also receives the product term P4, and generates a registered output R[7:0] at register 844. The register 846 is also coupled to receive UPI to generate R[15:8].

Turning now to FIGS. 17-20, the circuit of FIG. 16 may be used to implement various functions. The diagram of FIG. 17 shows an 16-bit by 16-bit multiply accumulate function using the circuit of FIG. 16 according to an embodiment of the present invention. In the example of FIG. 17, three CABs are used to generate the partial product values x210 and y210, while two CABs are used to generate a 32-bit value z[31:0] by adding a first 24 bit-value x[23:0] with a second 24-bit y[23:0] shifted by 8 bits, where the a0, a1 and b0, b1 values in the diagram are 8 bit values and z values comprise a 16 bit values. That is, the Z[31:0] output comprises the registered outputs of the first CAB and the second CAB which are concatenated.

Figure 18:
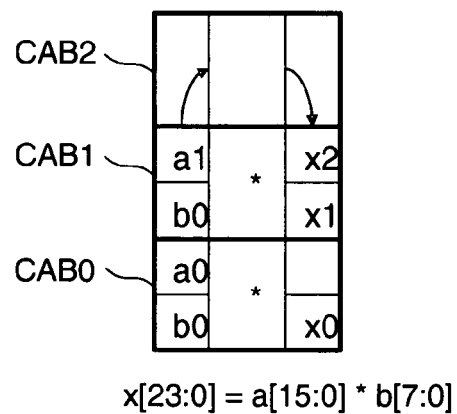
FIG. 18 is a diagram showing a 16-bit multiply function using the circuit of FIG. 16 according to an embodiment the present invention.
Figure 19:
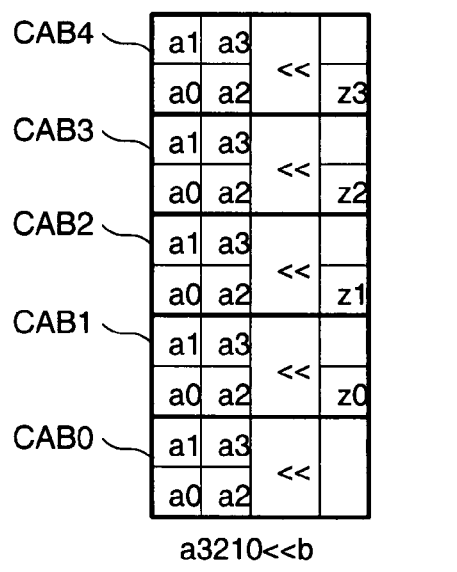
FIG. 19 is a diagram showing a 32-bit shift function using the circuit of FIG. 16 according to an embodiment of the present invention.
Figure 20:
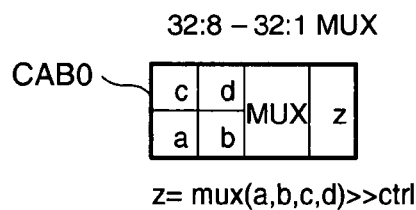
FIG. 20 is a diagram showing a 32-bit multiplexer using the circuit of FIG. 16 according to an embodiment of the present invention.

The diagram of FIG. 18 shows a 16-bit multiply function according to an embodiment the present invention. In particular, 3 CABs are used to implement the function x[23:0]=a[15:0]*b[7:0]. The diagram of FIG. 19 shows a 32-bit shift function according to an embodiment of the present invention. In particular, 5 CABs are used to implement the equation z3210=concat(z3, z2, z1, z0). Each of the CAB comprises a 32 bit value, where each of the values z3, z2, z1 and z0 comprises one of the values a0, a1, a2 or a3. The shift function is provided where the multiplexer 1602 is used to select the byte and the multiplexer 1604-1624 are used to select the shift value. Finally, the diagram of FIG. 20 shows a 32-bit multiplexer according to an embodiment of the present invention. In particular, the 32-bit multiplexer may be implemented in a single CAB according to the function z=mux(a,b,c,d)>>ctrl using the circuit of FIG. 16.

Figure 21:
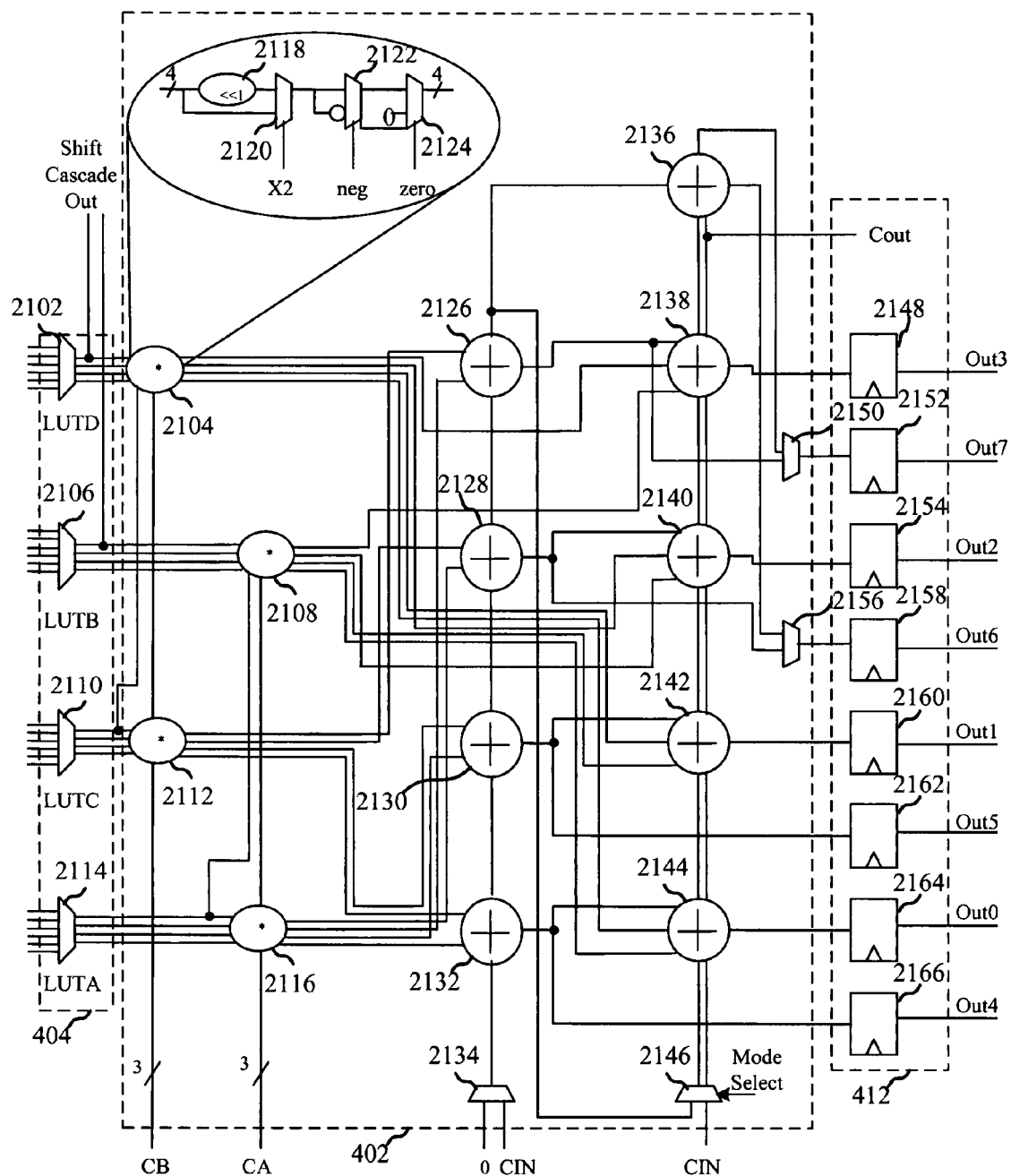
FIG. 21 is a block diagram of the configurable arithmetic block of the programmable logic device of FIG. 1 according to a further embodiment of the present invention.

Turning now to FIG. 21, a block diagram of the configurable arithmetic block of the programmable logic device of FIG. 1 according to a further embodiment of the present invention is shown. In particular, a plurality of four input LUTs are coupled to 4 bit multipliers. A first LUT 2102 is coupled to a first 4-bit multiplier 2104, a second LUT 2106 is coupled to a second 4-bit multiplier 2108, a third LUT 2110 is coupled to a third 4-bit multiplier 2112, and a fourth LUT 2114 is coupled to a fourth 4-bit multiplier 2116. The most significant bit of each of the first and second LUTs is provided as a shift cascade out. Each 4-bit multiplexer comprises a shift element 2118 and a first multiplexer 2120 controlled by a multiply signal X2 and coupled to receive the 4-bit output of the LUT and the output of the shifter. A second multiplexer 2122 is coupled to receive the output and an inverted output of the multiplexer 2120, and is controlled by a negative signal. Finally, a multiplexer 2124 is coupled to receive the output of the multiplexer 2122 and a logical "0" signal, and is controlled by a zero signal. By providing the "multiply by 2" function of the multiplexer 2118, the negative function of the multiplexer 2122, and the zero output function of the multiplexer 2124, the 4 bit multiplier is able to generate an output comprising any multiple of {−2, −1, 0, 1, 2} of the input.

The outputs of the 4-bit multipliers are coupled to a first level of adders comprising two input adders 2126, 2128, 2130 and 2132. The adder 2132 is also coupled to receive the carry output of a multiplexer 2134 which receive a carry in (CIN) signal or a logical "0" value. A second level of adders comprises three input adders 2136, 2138, 2140, 2142, and 2144 coupled to receive the outputs of the first level of adders and a carry signal from the first level of adders. The adder 2144 is also coupled to receive the output of a multiplexer 2146 which receives an output of the adder 2126 or a carry in (CIN) value. Each adder in the first level of adders and second level of adders is coupled to receive a carry from a lower adder, where a carry output (Gout) is generated by adder 2138. An output of the adder 2138 is also coupled to a multiplexer 2148 to generate an output signal "Out3." An output of the adder 2126 and an output of the adder 2136 are each coupled to a multiplexer 2150, the output of which is coupled to a register 2152 to generate an output signal "Out7." The output of adder 2140 is coupled to a register 2154 to generate an output "Out2." The output of the adder 2136 and the output of the adder 2128 are coupled to a multiplexer 2156, the output of which is coupled to a register 2158 to generate an output signal "Out6." The output of the adder 2142 is coupled to a register 2160 to generate an output signal "Out1." The output of the adder 2130 is coupled to the register 2162 to generate the output signal "Out5." The output of the adder 2144 is coupled to a register 2164 to generate an output signal "Out0." Finally, the output of the adder 2132 is coupled to a register 2166 to generate the output "Out4." A mode select signal is provided to the multiplexer 2146 to enable the selection between a two input adder and a three input adder requiring two carry in signals. That is, the selection mode signal enables the addition of 3 4-bit values which would require 2 carry bits by enabling the three input adders. Accordingly, the circuit of FIG. 21 provides a single structure for the arithmetic fabric circuit to flexibly implement arithmetic functions with fewer memory elements compared to the embodiment of FIG. 8.

Figure 22:
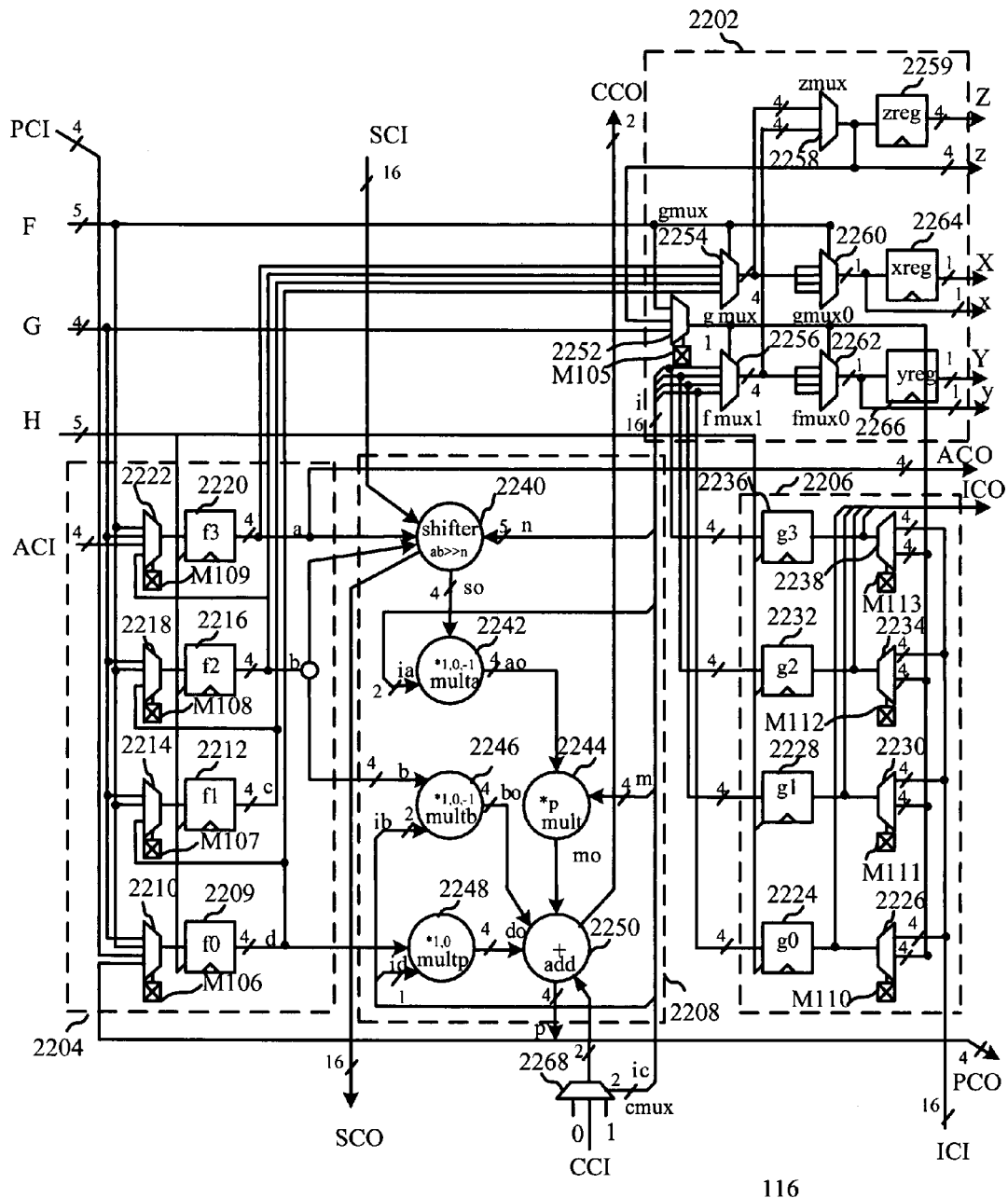
FIG. 22 is a block diagram of the configurable arithmetic block of the programmable logic device of FIG. 1 according to an alternate embodiment of the present invention.

Turning now to FIG. 22, a block diagram of a configurable arithmetic block 116 of the programmable logic device of FIG. 1 according to an alternate embodiment of the present invention is shown. While an output circuit 2202 comprises output registers as in a configurable logic block, additional outputs are generated, as will be described in more detail below. The arithmetic function circuit of FIG. 22 comprises a first block of LUTs 2204 comprising "f" LUTS, a second block of LUTs 2206 comprising "g" LUTS, and an arithmetic function circuit 2208 coupled to receive inputs from both blocks of LUTs and generate outputs to the output circuit 2202. The first block of LUTs 2204 comprises a first f LUT (f0) 2209 coupled to receive the output of a multiplexer 2210 which is controlled by a memory element M106. The multiplexer 2210 is coupled to receive F and G inputs, as well as an output of the arithmetic function circuit 2208. A second f LUT (f1) 2212 coupled to receive the output of a multiplexer 2214 which is controlled by a memory element M107. The multiplexer 2214 is coupled to receive F and G inputs, as well as an output of the LUT 2209. A third f LUT (f2) 2216 coupled to receive the output of a multiplexer 2218 which is controlled by a memory element M108. The multiplexer 2218 is coupled to receive F and G inputs, as well as an output of the LUT 2212. Finally, a fourth f LUT (f3) 2220 is coupled to receive the output of a multiplexer 2222 which is controlled by a memory element M109, and generates an output signal ACO. The multiplexer 2222 is coupled to receive F and G inputs, as well as an output of the LUT 2216.

The second block of LUTs 2206 comprises a first register 2224 coupled to receive the output of a multiplexer 2226 which selects an input I and a second input from the output of the g multiplexer 2252 based upon the value of a memory element M110. A second register 2228 is coupled to receive the output of a multiplexer 2230 which selects an input I and a second input from the output of the g multiplexer 2252 based upon the value of a memory element M111. A third register 2232 coupled to receive the output of a multiplexer 2234 which selects an input I and a second input from the output of the g multiplexer 2252 based upon the value of a memory element M112. Finally, a fourth register 2236 coupled to receive the output of a multiplexer 2238 which selects an instruction cascade input ICI and a second input from the output of the g multiplexer 2252 based upon the value of a memory element M113. An instruction cascade output ICO at the output of multiplexers 2226-2228 is also generated as an output of the configurable arithmetic block.

The arithmetic function circuit 2208 is coupled to receive the outputs of the first and second blocks of LUTS, and comprises a plurality of arithmetic function blocks including a shifter 2240. The shifter 2240 is coupled to receive the shift cascade input (SCI) signal from an adjacent CAB, and the outputs of the third and fourth f LUTs. The shifter 2240 generates a shift cascade output (SCO) signal. The shifter 2240 also generates an "so" signal output which is coupled to a first multiplier 2242. The first multiplier also receives an input "ia" signal from one of the g LUTs and generates an "ao" output signal which is coupled to a multiplier 2244 which also receives an "m" output from the g LUTs. A multiplier 2246 is coupled to receive the output of the f LUT 2209 and an "ib" signal from a g LUT. Another multiplier 2248 receives an output of the first f LUT and an "id" input from the g LUTs. Finally, an adder circuit 2250 is coupled to receive the output of multipliers 2244, 2246 and 2248, and generate an output product cascade out (PCO) and a carry cascade output (CCO). The functionality of the arithmetic function circuit 2208 will be described in more detail by way of example in reference to the tables of FIGS. 23-25.

The output circuit 2202 comprises a multiplexer 2252 coupled to receive a 4-bit F input and a 4-bit G input. A multiplexer 2254 is also coupled to receive the outputs of each of the f LUTS and is controlled by a bit of the F input signal. Another multiplexer 2256, which is controlled by the output of the multiplexer 2252, is coupled to receive the outputs of the g LUTs at its inputs. The outputs of the multiplexers 2254 and 2256 are coupled to a multiplexer 2258, the output of which comprises an unregistered "z" value, which is coupled to the z register 2259 to generate the registered "z" output. The outputs of the multiplexer 2254 is also coupled to a multiplexer 2260, the output of which comprises a single unregistered "x" value of the 4 bit input, which is coupled to the x register 2264 to generate the registered "x" output. Similarly, the outputs of the multiplexer 2256 is also coupled to a multiplexer 2262, the output of which comprises a single unregistered "y" value, which is coupled to the y register 2266 to generate the registered "y" output. As can be seen, the arithmetic function circuit comprises fewer memory bits compared to the implementation of the configurable arithmetic block in the circuit of FIG. 8.

Turning now to FIGS. 23-25, various tables are used to describe examples of the operation of the circuit of FIG. 22. While the table of FIG. 23 provides a description of the signals of the circuit of FIG. 22, the table of FIG. 24 shows examples of fundamental operating modes of the circuit of FIG. 22. In particular, seven fundamental modes of the circuit of FIG. 22 and the corresponding operation of the circuit in the modes according to the various inputs and outputs are shown. The Table of FIG. 25 shows the configuration of the circuit enabling various operating modes of the circuit of FIG. 22 according to an embodiment of the present invention. In particular, the 16 bits of the register of the g LUTs (g0-g3) of FIG. 22 are used by the various arithmetic function elements of the arithmetic function circuit 2208 to provide a certain function. The 16 bits of the register of the g LUTs are provided names which correspond to the inputs signal names to the arithmetic function circuit 2208, and corresponding names with respect to the operation of the circuit. In particular, data from certain g registers are used to implement the functions described in FIG. 25. For example, the bits of each of the g registers are used in implementing a 4-LUT. Data values "n0" and "n1", which are designated "s1" and "s0" when providing a delay function, are coupled to the shifter 2240 to provide a delay function. An adder is implemented by coupling the "ic0" and "ic1" values to a multiplexer 2268 and the "id" value to the multiplier 2248. A shifter is implemented by coupling the n0-n4 values, designated shift0-shift3, to the shifter 2240, and setting "ibo" to a logical "1." A multiplier is implemented by providing the ic0 and ic1 values to a multiplexer 2268, providing the "id" value to the multiplier 2248, providing the m0-m3 values to the multiplier 2244 and setting "ibo" to a logical "1." Finally, a multiplexer is implemented by providing n0-n3, designated as "sel16", "sel8", "sel4", and "sel2", to the shifter 2240 and setting "ibo" to a logical "1." While the functions of FIG. 25 and the operations of FIG. 24 are provided by way of example, other functions and operations may be implemented using the arithmetic function circuit 2208.

Figure 26:
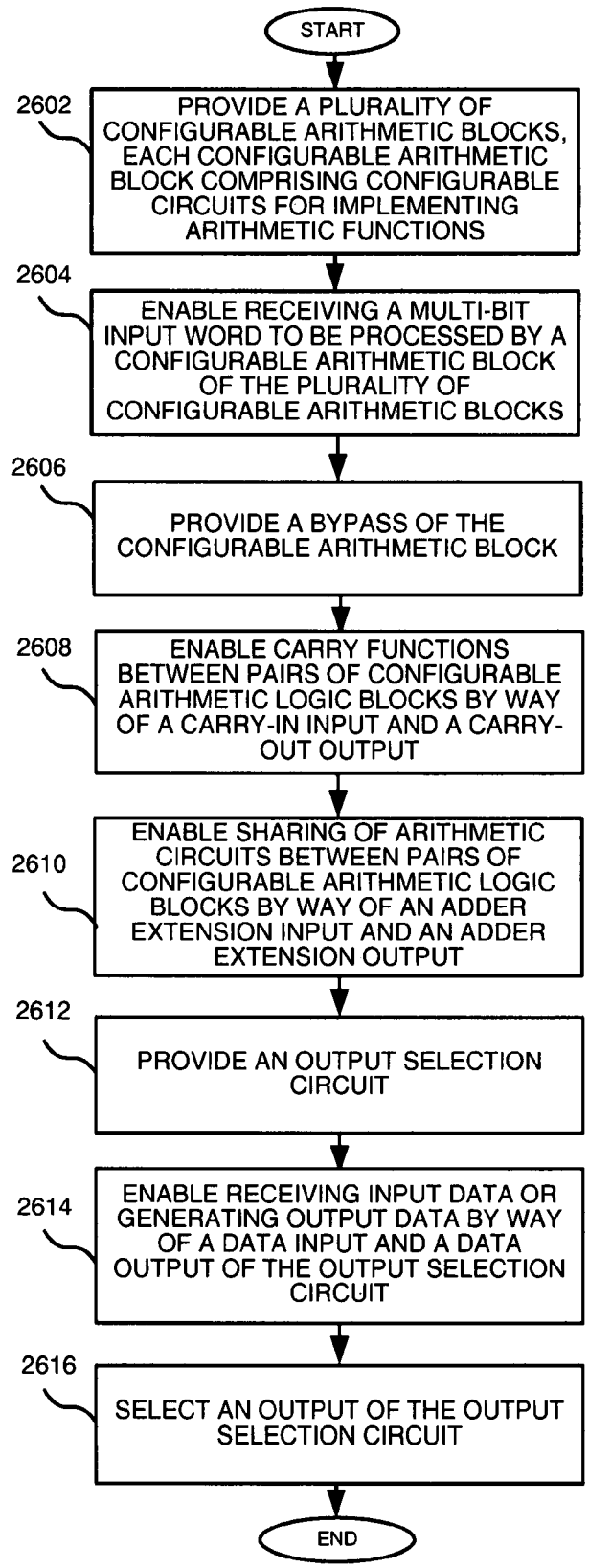
FIG. 26 is a flow chart showing a method of implementing an arithmetic function in a device having programmable logic according to an embodiment of the present invention.

Turning now to FIG. 26, a flow chart shows a method of implementing an arithmetic function in a device having programmable logic according to an embodiment of the present invention. A plurality of configurable arithmetic blocks is provided, where each configurable arithmetic block comprises configurable circuits for implementing arithmetic functions, at a step 2602. The circuit is enabled to receive a multi-bit input word to be processed by a configurable arithmetic block of the plurality of configurable arithmetic blocks at a step 2604. A bypass of the configurable arithmetic block is provided at a step 2606. Carry functions are enabled between pairs of configurable arithmetic logic blocks by way of a carry-in input and a carry-out output at a step 2608. Sharing of arithmetic circuits between pairs of configurable arithmetic logic blocks is also enabled by way of an adder extension input and an adder extension output at a step 2610. An output selection circuit is provided at a step 2612. Input data is enabled to be received or output data is enabled to be generated by way of a data input and a data output of the output selection circuit at a step 2614. Finally, an output of the output selection circuit is selected at a step 2616.

Figure 27:
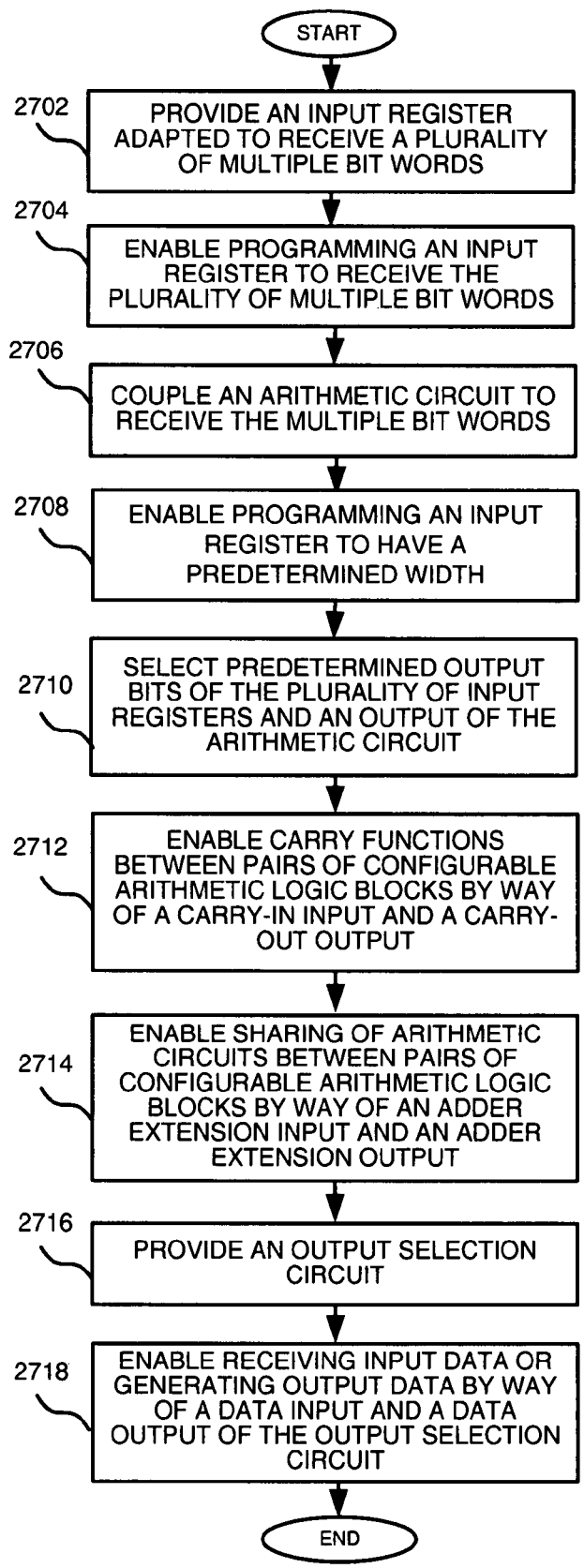
FIG. 27 is a flow chart showing a method of implementing a configurable arithmetic block in a device having programmable logic according to an embodiment of the present invention.

Turning now to FIG. 27, a flow chart shows a method of implementing an arithmetic function in a device having programmable logic according to an embodiment of the present invention. An input register adapted to receive a plurality of multi-bit words is provided at a step 2702. An input register is enabled to be programmed to receive the plurality of multi-bit words at a step 2704. An arithmetic circuit is coupled to receive the multi-bit words at a step 2706. An input register is enabled to be programmed to have a predetermined width at a step 2708. Predetermined output bits of the plurality of input registers and an output of the arithmetic circuit are selected at a step 2710. Carry functions between pairs of configurable arithmetic logic blocks are enabled by way of a carry-in input and a carry-out output at a step 2712. Sharing of arithmetic circuits between pairs of configurable arithmetic logic blocks is enabled by way of an adder extension input and an adder extension output at a step 2714. An output selection circuit is provided at a step 2716. Input data is enabled to be received by way of a data input and output data is enabled to be generated by way of a data output of the output selection circuit at a step 2718.

Figure 28:
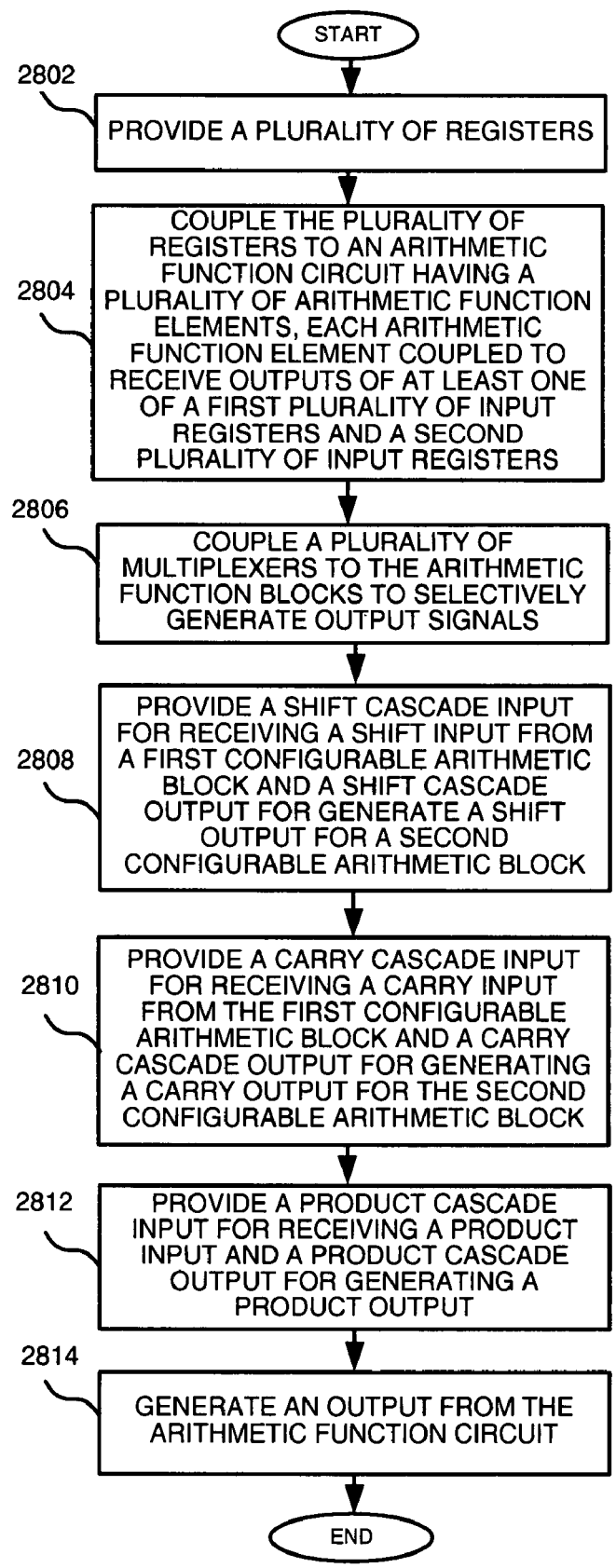
FIG. 28 is a flow chart showing a method of implementing a logic block having configurable arithmetic logic according to an embodiment of the present invention.

Turning now to FIG. 28, a flow chart shows a method of implementing a logic block having configurable arithmetic logic according to an embodiment of the present invention. A plurality of registers is provided at a step 2802. The plurality of registers is coupled to an arithmetic function circuit having a plurality of arithmetic function elements, each arithmetic function element coupled to receive outputs of at least one of a first plurality of input registers and a second plurality of input registers at a step 2804. A plurality of multiplexers is coupled to the arithmetic function blocks to selectively generate output signals at a step 2806. A shift cascade input is provided for receiving a shift input from a first configurable arithmetic block and a shift cascade output is provided for generating a shift output for a second configurable arithmetic block at a step 2808. A carry cascade input for receiving a carry input from the first configurable arithmetic block and a carry cascade output for generating a carry output for the second configurable arithmetic block are provided at a step 2810. A product cascade input for receiving a product input and a product cascade output for generating a product output are providing at a step 2812. An output is generated from the arithmetic function circuit at a step 2814. The methods of FIGS. 26-28 may be implemented using any of the circuits of FIGS. 1-25 as described above, or any other suitable circuit.

While specific implementations of circuit and methods of implementing arithmetic functions are described, the selection of particular features will be determined by analysis of the statistical usage of operations encountered in DSP applications, analysis of the silicon and performance cost of implementing optimized features, and maximizing the density and performance of the 'typical' DSP application by selecting the optimal mix of features. This invention addresses future migration of designs by defining basic word level operations and then implementing them in a most efficient format. Future devices may implement these same basic operations in an alternate fashion, but by supporting the basic operations, current designs may be mapped to future devices.

It can therefore be appreciated that the new and novel device having programmable logic and method of implementing an arithmetic function in a device having programmable logic has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A configurable arithmetic block in a device having programmable resources for implementing arithmetic functions, the configurable arithmetic block comprising:
 a plurality of input registers coupled to receive multiple bit words, wherein the plurality of input registers comprises a plurality of lookup tables;
 an arithmetic function circuit coupled to receive the multiple bit words;
 an output selection circuit coupled to receive the output of the plurality of input registers and an output of the arithmetic function circuit; and
 a plurality of output registers coupled to the output selection circuit.

2. The configurable arithmetic block of claim 1 further comprising an output multiplexer coupled to an output of the output selection circuit and the plurality of input registers.

3. The configurable arithmetic block of claim 1 wherein the arithmetic function circuit is further coupled to receive a carry-in input signal and generate a carry-out output signal for enabling transferring carry signals with other configurable arithmetic logic blocks.

4. The configurable arithmetic block of claim 3 wherein the arithmetic function circuit further comprises an adder extension input and an adder extension output for enabling the sharing of arithmetic function circuits with the other configurable arithmetic logic blocks of the device.

5. The configurable arithmetic block of claim 1 wherein the output selection circuit is coupled to receive a data input signal and generate a data-out signal.

6. The configurable arithmetic block of claim 5 wherein the output selection circuit selects one of an output of the plurality of input registers, the output of the arithmetic function circuit, or the data input signal.

7. The configurable arithmetic block of claim 1, wherein the plurality of lookup tables comprises a plurality of programmable shift registers.

8. A method of implementing arithmetic functions in a device having programmable resources, the method comprising:
 programming an input register to receive a plurality of multiple bit words;
 receiving a plurality of multiple bit words at the input register;
 coupling an arithmetic function circuit to the input register to receive the multiple bit words; and
 selecting an output from an output of the input register and an output of the arithmetic function circuit;
 wherein receiving a plurality of multiple bit words at the input register comprises receiving a plurality of multiple bit words at a programmable shift register adapted to receive a serial input data signal and a parallel input data signal.

9. The method of claim 8 further comprising coupling the selected output to a plurality of output registers.

10. The method of claim 8 further comprising enabling carry functions between the arithmetic function circuit and another arithmetic function circuit by way of a carry-in input and a carry-out output.

11. The method of claim 8 further comprising enabling sharing of arithmetic circuits of another arithmetic function circuit by way of an adder extension output.

12. The method of claim 8 further coupling a configuration bitstream to the device having programmable resources, the configuration bitstream enabling programming the input register to receive the plurality of multiple bit words.

* * * * *